(12) United States Patent
Kosowsky

(10) Patent No.: US 9,144,151 B2
(45) Date of Patent: Sep. 22, 2015

(54) CURRENT-CARRYING STRUCTURES FABRICATED USING VOLTAGE SWITCHABLE DIELECTRIC MATERIALS

(75) Inventor: Lex Kosowsky, San Jose, CA (US)

(73) Assignee: LITTELFUSE, INC., Chicago, IL (US)

( * ) Notice: Subject to any disclaimer, the term of this patent is extended or adjusted under 35 U.S.C. 154(b) by 0 days.

(21) Appl. No.: 12/284,790

(22) Filed: Sep. 24, 2008

(65) Prior Publication Data

US 2009/0044970 A1 Feb. 19, 2009

Related U.S. Application Data

(63) Continuation of application No. 10/941,226, filed on Sep. 14, 2004, now Pat. No. 7,446,030, which is a continuation-in-part of application No. 10/315,496, filed on Dec. 9, 2002, now Pat. No. 6,797,145, which is a continuation of application No. 09/437,882, filed on Nov. 10, 1999, now abandoned.

(60) Provisional application No. 60/151,188, filed on Aug. 27, 1999.

(51) Int. Cl.
*H05K 1/03* (2006.01)
*H05K 1/09* (2006.01)
(Continued)

(52) U.S. Cl.
CPC ............... *H05K 1/0254* (2013.01); *C25D 5/54* (2013.01); *H05K 1/0373* (2013.01); *H05K 3/188* (2013.01); *H05K 1/167* (2013.01); *H05K 3/423* (2013.01); *H05K 3/426* (2013.01); *H05K 2201/0215* (2013.01); *H05K 2201/0738* (2013.01); *H05K 2203/105* (2013.01); *Y10T 29/49117* (2015.01);
(Continued)

(58) Field of Classification Search
CPC ........... H05K 1/09; H05K 3/46; H01L 21/768
USPC ............... 174/256, 250, 257; 29/846; 205/80, 205/125, 223; 361/782
See application file for complete search history.

(56) References Cited

U.S. PATENT DOCUMENTS

| | | | |
|---|---|---|---|
| 3,347,724 A | 10/1967 | Schneble, Jr. et al. | |
| 3,685,026 A | 8/1972 | Wakabayashi et al. | |

(Continued)

FOREIGN PATENT DOCUMENTS

| | | | |
|---|---|---|---|
| AU | WO 8906589 A1 | 7/1989 | |
| CH | 663491 A5 | 12/1987 | |

(Continued)

OTHER PUBLICATIONS

U.S. Appl. No. 12/694,702, Kosowsky, Substrates Having Voltage Switchable Dielectric Materials, filed Jan. 27, 2010.

(Continued)

*Primary Examiner* — Yuriy Semenenko
(74) *Attorney, Agent, or Firm* — Kacvinsky Daisak Bluni PLLC

(57) ABSTRACT

A method comprises providing a voltage switchable dielectric material having a characteristic voltage, exposing the voltage switchable dielectric material to a source of ions associated with an electrically conductive material, and creating a voltage difference between the source and the voltage switchable dielectric material that is greater than the characteristic voltage. Electrical current is allowed to flow from the voltage switchable dielectric material, and the electrically conductive material is deposited on the voltage switchable dielectric material. A body comprises a voltage switchable dielectric material and a conductive material deposited on the voltage switchable dielectric material using an electrochemical process. In some cases, the conductive material is deposited using electroplating.

7 Claims, 10 Drawing Sheets

(51) Int. Cl.
*H05K 1/02* (2006.01)
*C25D 5/54* (2006.01)
*H05K 3/18* (2006.01)
*H05K 1/16* (2006.01)
*H05K 3/42* (2006.01)

(52) U.S. Cl.
CPC ...... *Y10T 29/49126* (2015.01); *Y10T 29/49128* (2015.01); *Y10T 29/49155* (2015.01)

(56) References Cited

U.S. PATENT DOCUMENTS

| | | | |
|---|---|---|---|
| 3,685,028 A | 8/1972 | Wakabayashi et al. | |
| 3,723,635 A | 3/1973 | Smith | |
| 3,808,576 A | 4/1974 | Castonguay et al. | |
| 3,926,916 A | 12/1975 | Mastrangelo | |
| 3,977,957 A | 8/1976 | Kosowsky et al. | |
| 4,113,899 A | 9/1978 | Henry et al. | |
| 4,133,735 A | 1/1979 | Afromowitz et al. | |
| 4,252,692 A | 2/1981 | Taylor et al. | |
| 4,331,948 A | 5/1982 | Malinaric et al. | |
| 4,359,414 A | 11/1982 | Mastrangelo | |
| 4,405,432 A | 9/1983 | Kosowsky | |
| 4,439,809 A | 3/1984 | Weight et al. | |
| 4,506,285 A | 3/1985 | Einzinger et al. | |
| 4,591,411 A | 5/1986 | Reimann | |
| 4,642,160 A | 2/1987 | Burgess | |
| 4,702,860 A | 10/1987 | Kinderov et al. | |
| 4,726,877 A | 2/1988 | Fryd et al. | |
| 4,726,991 A | 2/1988 | Hyatt et al. | |
| 4,799,128 A | 1/1989 | Chen | |
| 4,888,574 A * | 12/1989 | Rice et al. | 338/309 |
| 4,892,776 A | 1/1990 | Rice | |
| 4,918,033 A | 4/1990 | Bartha et al. | |
| 4,928,199 A | 5/1990 | Diaz et al. | |
| 4,935,584 A | 6/1990 | Boggs | |
| 4,977,357 A | 12/1990 | Shrier | |
| 4,992,333 A | 2/1991 | Hyatt | |
| 4,996,945 A | 3/1991 | Dix, Jr. | |
| 5,068,634 A | 11/1991 | Shrier | |
| 5,092,032 A | 3/1992 | Murakami | |
| 5,095,626 A | 3/1992 | Kitamura et al. | |
| 5,099,380 A | 3/1992 | Childers et al. | |
| 5,142,263 A | 8/1992 | Childers et al. | |
| 5,148,355 A | 9/1992 | Lowe et al. | |
| 5,183,698 A | 2/1993 | Stephenson et al. | |
| 5,189,387 A | 2/1993 | Childers et al. | |
| 5,246,388 A | 9/1993 | Collins et al. | |
| 5,248,517 A * | 9/1993 | Shrier et al. | 427/58 |
| 5,252,195 A | 10/1993 | Kobayashi et al. | |
| 5,260,848 A | 11/1993 | Childers | |
| 5,262,754 A | 11/1993 | Collins | |
| 5,278,535 A | 1/1994 | Xu et al. | |
| 5,282,312 A | 2/1994 | DiStefano et al. | |
| 5,294,374 A | 3/1994 | Martinez et al. | |
| 5,295,297 A | 3/1994 | Kitamura et al. | |
| 5,300,208 A | 4/1994 | Angelopoulos et al. | |
| 5,317,801 A | 6/1994 | Tanaka et al. | |
| 5,340,641 A | 8/1994 | Xu | |
| 5,347,258 A | 9/1994 | Howard et al. | |
| 5,354,712 A | 10/1994 | Ho et al. | |
| 5,367,764 A | 11/1994 | DiStefano et al. | |
| 5,378,858 A | 1/1995 | Bruckner et al. | |
| 5,380,679 A | 1/1995 | Kano | |
| 5,393,597 A | 2/1995 | Childers et al. | |
| 5,403,208 A | 4/1995 | Felcman et al. | |
| 5,404,637 A | 4/1995 | Kawakami | |
| 5,413,694 A | 5/1995 | Dixon et al. | |
| 5,416,662 A | 5/1995 | Kurasawa et al. | |
| 5,440,075 A | 8/1995 | Kawakita et al. | |
| 5,444,593 A | 8/1995 | Allina | |
| 5,476,471 A | 12/1995 | Shifrin et al. | |
| 5,481,795 A | 1/1996 | Hatakeyama et al. | |
| 5,483,407 A | 1/1996 | Anastasio et al. | |
| 5,487,218 A | 1/1996 | Bhatt et al. | |
| 5,493,146 A | 2/1996 | Pramanik et al. | |
| 5,501,350 A | 3/1996 | Yoshida et al. | |
| 5,502,889 A | 4/1996 | Casson et al. | |
| 5,510,629 A | 4/1996 | Karpovich et al. | |
| 5,550,400 A | 8/1996 | Takagi et al. | |
| 5,557,136 A | 9/1996 | Gordon et al. | |
| 5,654,564 A | 8/1997 | Mohsen | |
| 5,669,381 A | 9/1997 | Hyatt | |
| 5,685,070 A | 11/1997 | Alpaugh et al. | |
| 5,708,298 A | 1/1998 | Masayuki et al. | |
| 5,714,794 A | 2/1998 | Tsuyama et al. | |
| 5,734,188 A | 3/1998 | Murata et al. | |
| 5,744,759 A | 4/1998 | Ameen et al. | |
| 5,781,395 A | 7/1998 | Hyatt | |
| 5,802,714 A | 9/1998 | Kobayashi et al. | |
| 5,807,509 A | 9/1998 | Shrier et al. | |
| 5,808,351 A | 9/1998 | Nathan et al. | |
| 5,834,160 A | 11/1998 | Ferry et al. | |
| 5,834,824 A | 11/1998 | Shepherd et al. | |
| 5,834,893 A | 11/1998 | Bulovic et al. | |
| 5,848,467 A | 12/1998 | Khandros et al. | |
| 5,856,910 A | 1/1999 | Yurchenko et al. | |
| 5,865,934 A | 2/1999 | Yamamoto et al. | |
| 5,869,869 A | 2/1999 | Hively | |
| 5,874,902 A | 2/1999 | Heinrich et al. | |
| 5,906,042 A | 5/1999 | Lan et al. | |
| 5,910,685 A | 6/1999 | Watanabe et al. | |
| 5,926,951 A | 7/1999 | Khandros et al. | |
| 5,940,683 A | 8/1999 | Holm et al. | |
| 5,946,555 A | 8/1999 | Crumly et al. | |
| 5,955,762 A | 9/1999 | Hively | |
| 5,956,612 A | 9/1999 | Elliott et al. | |
| 5,962,815 A | 10/1999 | Lan et al. | |
| 5,970,321 A | 10/1999 | Hively | |
| 5,972,192 A | 10/1999 | Dubin et al. | |
| 5,977,489 A | 11/1999 | Crotzer et al. | |
| 6,013,358 A | 1/2000 | Winnett et al. | |
| 6,023,028 A | 2/2000 | Neuhalfen | |
| 6,064,094 A | 5/2000 | Intrater et al. | |
| 6,108,184 A | 8/2000 | Minervini et al. | |
| 6,114,672 A | 9/2000 | Iwasaki | |
| 6,130,459 A | 10/2000 | Intrater | |
| 6,160,695 A | 12/2000 | Winnett et al. | |
| 6,172,590 B1 | 1/2001 | Shrier et al. | |
| 6,184,280 B1 | 2/2001 | Shituba | |
| 6,191,928 B1 | 2/2001 | Rector et al. | |
| 6,198,392 B1 | 3/2001 | Hahn et al. | |
| 6,211,554 B1 | 4/2001 | Whitney et al. | |
| 6,239,687 B1 * | 5/2001 | Shrier et al. | 338/21 |
| 6,251,513 B1 | 6/2001 | Rector et al. | |
| 6,310,752 B1 | 10/2001 | Shrier et al. | |
| 6,316,734 B1 | 11/2001 | Yang | |
| 6,340,789 B1 | 1/2002 | Petritsch et al. | |
| 6,351,011 B1 | 2/2002 | Whitney et al. | |
| 6,373,719 B1 | 4/2002 | Behling et al. | |
| 6,407,411 B1 | 6/2002 | Wojnarowski | |
| 6,433,394 B1 | 8/2002 | Intrater | |
| 6,448,900 B1 | 9/2002 | Chen | |
| 6,455,916 B1 | 9/2002 | Robinson | |
| 6,468,593 B1 | 10/2002 | Iazawa | |
| 6,512,458 B1 | 1/2003 | Kobayashi et al. | |
| 6,534,422 B1 | 3/2003 | Ichikawa et al. | |
| 6,542,065 B2 | 4/2003 | Shrier et al. | |
| 6,549,114 B2 * | 4/2003 | Whitney et al. | 338/21 |
| 6,570,765 B2 | 5/2003 | Behling et al. | |
| 6,593,597 B2 | 7/2003 | Sheu | |
| 6,621,172 B2 | 9/2003 | Nakayama | |
| 6,628,498 B2 | 9/2003 | Whitney et al. | |
| 6,642,297 B1 | 11/2003 | Hyatt et al. | |
| 6,657,532 B1 | 12/2003 | Shrier et al. | |
| 6,693,508 B2 | 2/2004 | Whitney et al. | |
| 6,709,944 B1 | 3/2004 | Durocher et al. | |
| 6,741,217 B2 | 5/2004 | Toncich et al. | |
| 6,797,145 B2 | 9/2004 | Kosowsky | |
| 6,882,051 B2 | 4/2005 | Majumdar et al. | |
| 6,903,175 B2 | 6/2005 | Gore et al. | |
| 6,911,676 B2 | 6/2005 | Yoo | |
| 6,916,872 B2 | 7/2005 | Yadav et al. | |
| 6,981,319 B2 | 1/2006 | Shrier | |

(56) References Cited

U.S. PATENT DOCUMENTS

| | | |
|---|---|---|
| 7,034,652 B2 | 4/2006 | Whitney et al. |
| 7,049,926 B2 | 5/2006 | Shrier et al. |
| 7,053,468 B2 | 5/2006 | Lee |
| 7,064,353 B2 | 6/2006 | Bhat |
| 7,132,697 B2 | 11/2006 | Weimer et al. |
| 7,132,922 B2 | 11/2006 | Harris et al. |
| 7,141,184 B2 | 11/2006 | Chacko et al. |
| 7,173,288 B2 | 2/2007 | Lee et al. |
| 7,183,891 B2 | 2/2007 | Harris et al. |
| 7,202,770 B2 | 4/2007 | Harris et al. |
| 7,205,613 B2 | 4/2007 | Fjelstand et al. |
| 7,218,492 B2 | 5/2007 | Shrier |
| 7,279,724 B2 | 10/2007 | Collins et al. |
| 7,320,762 B2 | 1/2008 | Greuter et al. |
| 7,417,194 B2 | 8/2008 | Shrier |
| 7,446,030 B2 | 11/2008 | Kosowsky |
| 7,488,625 B2 | 2/2009 | Knall |
| 7,492,504 B2 | 2/2009 | Chopra et al. |
| 7,528,467 B2 | 5/2009 | Lee |
| 7,535,462 B2 | 5/2009 | Spath et al. |
| 7,585,434 B2 | 9/2009 | Morita |
| 7,609,141 B2 | 10/2009 | Harris |
| 8,045,312 B2 * | 10/2011 | Shrier ............................ 361/126 |
| 2002/0061363 A1 | 5/2002 | Halas et al. |
| 2003/0010960 A1 | 1/2003 | Greuter et al. |
| 2003/0079910 A1 | 5/2003 | Kosowsky |
| 2003/0151029 A1 | 8/2003 | Hsu |
| 2003/0218851 A1 | 11/2003 | Harris et al. |
| 2004/0095658 A1 | 5/2004 | Buretea et al. |
| 2004/0154828 A1 | 8/2004 | Moller et al. |
| 2004/0201941 A1 | 10/2004 | Harris |
| 2004/0211942 A1 | 10/2004 | Clark et al. |
| 2004/0262583 A1 | 12/2004 | Lee |
| 2005/0039949 A1 | 2/2005 | Kosowsky |
| 2005/0057867 A1 | 3/2005 | Harris |
| 2005/0106098 A1 | 5/2005 | Tsang et al. |
| 2005/0218380 A1 | 10/2005 | Gramespacher et al. |
| 2005/0274455 A1 | 12/2005 | Extrand |
| 2005/0274956 A1 | 12/2005 | Bhat |
| 2005/0275070 A1 | 12/2005 | Hollingsworth |
| 2006/0060880 A1 | 3/2006 | Lee et al. |
| 2006/0142455 A1 | 6/2006 | Agarwal |
| 2006/0152334 A1 | 7/2006 | Maercklein et al. |
| 2006/0167139 A1 | 7/2006 | Nelson et al. |
| 2006/0181826 A1 | 8/2006 | Dudnikov, Jr. et al. |
| 2006/0181827 A1 | 8/2006 | Dudnikov, Jr. et al. |
| 2006/0193093 A1 | 8/2006 | Bertin |
| 2006/0199390 A1 | 9/2006 | Dudnikov, Jr. et al. |
| 2006/0211837 A1 | 9/2006 | Ko et al. |
| 2006/0234127 A1 | 10/2006 | Kim |
| 2006/0291127 A1 | 12/2006 | Kim et al. |
| 2007/0116976 A1 | 5/2007 | Tan et al. |
| 2007/0139848 A1 * | 6/2007 | Harris et al. .................. 361/118 |
| 2007/0146941 A1 | 6/2007 | Harris et al. |
| 2007/0208243 A1 | 9/2007 | Gabriel et al. |
| 2008/0045770 A1 | 2/2008 | Sigmund et al. |
| 2008/0047930 A1 | 2/2008 | Blanchet et al. |
| 2008/0278873 A1 | 11/2008 | Leduc et al. |
| 2009/0309074 A1 | 12/2009 | Chen et al. |

FOREIGN PATENT DOCUMENTS

| | | |
|---|---|---|
| DE | 3040784 A1 | 5/1982 |
| DE | 10115333 A1 | 1/2002 |
| DE | 102004049053 | 5/2005 |
| DE | 102006047377 | 4/2008 |
| EP | 0790758 | 8/1997 |
| EP | 1003229 A1 | 5/2000 |
| EP | 1542240 A2 | 6/2006 |
| JP | 56091464 A | 7/1981 |
| JP | 63 195275 A | 8/1988 |
| JP | 2000 062076 A1 | 2/2000 |
| KR | WO 2005100426 A1 | 10/2005 |
| WO | WO97/26665 | 7/1997 |
| WO | WO98/23018 | 5/1998 |
| WO | WO99/24992 | 5/1999 |

OTHER PUBLICATIONS

U.S. Appl. No. 12/731,557, Kosowsky, Components Having Voltage Switchable Dielectric Materials, filed Mar. 25, 2010.
U.S. Appl. No. 12/607,952, Fleming, filed Oct. 28, 2009.
U.S. Appl. No. 12/642,799, Fleming, filed Dec. 19, 2009.
U.S. Appl. No. 12/638,632, Fleming, filed Dec. 15, 2009.
U.S. Appl. No. 12/692,573, Fleming, filed Jan. 22, 2010.
U.S. Appl. No. 12/717,102, Kosowsky, filed Mar. 3, 2010.
Levinson et al. "The Physics of Metal Oxide Varistors," J. App. Phys. 46 (3): 1332-1341 (1975).
Wikipedia article for "Fullerene chemistry" as originally published on Apr. 8, 2010. http://en.wikipedia.org/wiki/Fullerene_chemistry.
U.S. Appl. No. 11/562,222, Kosowsky, Wireless Communication Device Using Voltage Switchable Dielectric Material, filed Nov. 21, 2006.
U.S. Appl. No. 11/562,289, Kosowsky, Light-Emitting Device Using Voltage Switchable Dielectric Material, filed Nov. 21, 2006.
U.S. Appl. No. 11/602,881, Kosowsky, Semiconductor Devices Including Voltage Switchable Materials for Over-Voltage Protection, filed Nov. 21, 2006.
U.S. Appl. No. 11/829,946, Kosowsky, Voltage Switchable Dielectric Material Having Conductive or Semi-Conductive Organic Material, filed Jul. 29, 2007.
U.S. Appl. No. 11/829,948, Kosowsky, Voltage Switchable Dielectric Material Having High Aspect Ratio Particles, filed Jul. 29, 2007.
U.S. Appl. No. 11/829,951, Kosowsky, Voltage Switchable Dielectric Material Having Conductive or Semi-Conductive Organic Material, filed Jul. 29, 2007.
U.S. Appl. No. 11/860,522, Kosowsky, Technique for Plating Substrate Devices Using Voltage Switchable Dielectric Material and Light Assistance, filed Sep. 24, 2007.
U.S. Appl. No. 11/860,530, Kosowsky, System and Method for Including Protective Voltage Switchabel Dielectric Material in the Design or Simulation of Substrate Devices, filed Sep. 24, 2007.
U.S. Appl. No. 11/881,896, Kosowsky, Device Applications for Voltage Switchable Dielectric Material Having High Aspect Ratio Particles, filed Jul. 29, 2007.
U.S. Appl. No. 11/903,820, Kosowsky, Formulations for Voltage Switchable Dielectric Materials Having a Stepped Voltage Response and Methods for Making the Same, filed Sep. 24, 2007.
U.S. Appl. No. 12/193,603, Kosowsky, Voltage Switchable Dielectric Material Incorporating Modified High Aspect Ratio Particles, filed Aug. 18, 2008.
U.S. Appl. No. 12/284,790, Kosowsky, Methods for Fabricating Current-Carrying Structures Using Voltage Switchable Dielectric Materials, filed Sep. 24, 2008.
U.S. Appl. No. 12/356,490, Fleming, Voltage Switchable Dielectric Material Having Bonded Particle Constituents, filed Jan. 20, 2009.
U.S. Appl. No. 12/370,589, Fleming, Voltage Switchable Dielectric Material With Superior Physical Properties for Structural Applications, filed Feb. 12, 2009.
U.S. Appl. No. 12/407,346, Fleming, Voltage Switchable Dielectric Materials With Low Band Gap Polymer Binder or Composite, filed Mar. 19, 2009.
U.S. Appl. No. 12/417,589, Kosowsky, Substrate Device or Package Using Embedded Layer of Voltage Switchable Dielectric Material in a Vertical Switching Configuration, filed Apr. 2, 2009.
U.S. Appl. No. 12/541,963, Kosowsky, Core Layer Structure Having Voltage Switchable Dielectric Material, filed Aug. 16, 2009.
U.S. Appl. No. 12/561,195, Kosowsky, Voltage Switchable Dielectric Material Containing Boron Compound, filed Sep. 16, 2009.
U.S. Appl. No. 12/571,318, Kosowsky, Voltage Switchable Dielectric Material Incorporating Conductive Core-Shell Particles, filed Sep. 30, 2009.
U.S. Appl. No. 12/608,297, Kosowsky, Metal Deposition, filed Oct. 29, 2009.
U.S. Appl. No. 12/608,301, Kosowsky, Metal Deposition, filed Oct. 29, 2009.

(56) References Cited

OTHER PUBLICATIONS

U.S. Appl. No. 12/608,309, Kosowsky, Metal Deposition, filed Oct. 29, 2009.
U.S. Appl. No. 12/608,315, Kosowsky, Metal Deposition, filed Oct. 29, 2009.
U.S. Appl. No. 12/608,326, Kosowsky, Metal Deposition, filed Oct. 29, 2009.
Breton et al., "Mechanical properties of multiwall carbon nanotubes/epoxy composites: influence of network morphology," Carbon Elsevier UK, vol. 42, No. 5-6, pp. 1027-1030 (2004).
Celzard, A., et al., "Conduction Mechanisms in Some Graphite-polymer Composites: The Effect of a Direct-current Electric Field", Journal of Physics: Condensed Matter, 9 (1997) pp. 2225-2237.
Facchetti, Antonio, "Semiconductors for Organic Transistors", Materials Today, vol. 10, No. 3, pp. 28-37.
Granstrom et al., "laminated fabrication of polymeric photovoltaic diodes," Nature, vol. 395, pp. 257-260 (1998).
Guo et al., "Block Copolymer Modified Novolac Epoxy Resin," Polymer Physics, vol. 41, No. 17, pp. 1994-2003 (2003).
Modine, F.A. and Hyatt, H.M. "New Varistor Material", Journal of Applied Physics, 64 (8), Oct. 15, 1988, pp. 4229-4232.
Onoda et al., "Photoinduced Charge Transfer of Conducting Polymer Compositions," IEICE Trans. Electronics, vol. E81-C(7), pp. 1051-1056 (1998).
Raffaelle et al., "Nanomaterial Development for Polymeric Solar Cells," IEEE 4th World Conf on Photovoltaic energy Conversion, pp. 186-189 (2006).
Reese, Colin and Bao, Zhenan, "Organic Single-Crystal Field-Effect Transistors", Materials Today, vol. 10, No. 3, pp. 20-27.
Saunders et al., "Nanoparticle-polymer photovoltaic cells," Adv. Colloid Int. Sci., vol. 138, No. 1, pp. 1-23 (2007).

* cited by examiner

CURRENT-CARRYING STRUCTURES FABRICATED USING VOLTAGE SWITCHABLE DIELECTRIC MATERIALS

CROSS-REFERENCE TO RELATED APPLICATIONS

This application is a continuation and claims the benefit of U.S. application Ser. No. 10/941,226, issued as U.S. Pat. No. 7,446,030, on Nov. 4, 2008, and filed on Sep. 14, 2004, which is a continuation-in-part of U.S. application Ser. No. 10/315,496, filed on Dec. 9, 2002, now U.S. Pat. No. 6,767,145, which is a continuation of U.S. application Ser. No.09/437,882, filed Nov. 10, 1999, now abandoned, which claims the priority benefit of U.S. Provisional Application No. 60/151,188, filed on Aug. 27, 1999. Each of these applications is incorporated herein by reference.

BACKGROUND OF THE INVENTION

1. Field of the Invention

This invention relates to the field of current-carrying devices and components. In particular, the invention relates to a current-carrying device including a substrate and a conductive layer.

2. Description of the Related Art

Current-carrying structures are generally fabricated by subjecting a substrate to a series of manufacturing steps. Examples of such current-carrying structures include printed circuit boards, printed wiring boards, backplanes, and other micro-electronic types of circuitry. The substrate is typically a rigid, insulative material such as epoxy-impregnated glass fiber laminate. A conductive material, such as copper, is patterned to define conductors, including ground and power planes.

Some prior art current-carrying devices are manufactured by layering a conductive material over a substrate. A mask layer is deposited on the conductive layer, exposed, and developed. The resulting pattern exposes select regions where conductive material is to be removed from the substrate. The conductive layer is removed from the select regions by etching. The mask layer is subsequently removed, leaving a patterned layer of the conductive material on the surface of the substrate. In other prior art processes, an electroless process is used to deposit conductive lines and pads on a substrate. A plating solution is applied to enable conductive material to adhere to the substrate on selected portions of the substrate to form patterns of conductive lines and pads.

To maximize available circuitry in a limited footprint, substrate devices sometimes employ multiple substrates, or use both surfaces of one substrate to include componentry and circuitry. The result in either case is that multiple substrate surfaces in one device need to be interconnected to establish electrical communication between components on different substrate surfaces. In some devices, sleeves or vias provided with conductive layering extend through the substrate to connect the multiple surfaces. In multi-substrate devices, such vias extend through at least one substrate to interconnect one surface of that substrate to a surface of another substrate. In this way, an electrical link is established between electrical components and circuitry on two surfaces of the same substrate, or on surfaces of different substrates.

In some processes, via surfaces are plated by first depositing a seed layer of a conductive material followed by an electrolytic process. In other processes, adhesives are used to attach conductive material to via surfaces. In these devices, the bond between the vias and conductive material is mechanical in nature.

Certain materials, referred to below as voltage switchable dielectric materials, have been used in prior art devices to provide over-voltage protection. Because of their electrical resistance properties, these materials are used to dissipate voltage surges from, for example, lightning, static discharge, or power surges. Accordingly, voltage switchable dielectric materials are included in some devices, such as printed circuit boards. In these devices, a voltage switchable dielectric material is inserted between conductive elements and the substrate to provide over-voltage protection.

SUMMARY

Various aspects include a method for fabricating a current-carrying formation. The method comprises providing a first voltage switchable dielectric material having a first characteristic voltage, exposing the first voltage switchable dielectric material to a first source of ions associated with a first electrically conductive material, and creating a first voltage difference between the first source and the first voltage switchable dielectric material. The first voltage difference may be greater than the first characteristic voltage. Electrical current is allowed to flow from the first voltage switchable dielectric material, and the first electrically conductive material is deposited on the first voltage switchable dielectric material.

In some cases, the first voltage switchable dielectric material may be exposed to a second source of ions associated with a second electrically conductive material. In such cases, a second voltage difference, greater than the first characteristic voltage, may be created between the first voltage switchable dielectric material and the second source. Electrical current is allowed to flow from the first voltage switchable dielectric material during application of the second voltage difference, and the second electrically conductive material is deposited on the first voltage switchable dielectric material.

In certain aspects, a second voltage switchable dielectric material is provided, which may have a second characteristic voltage. A second voltage difference, greater than the second characteristic voltage, is created between the first source and the second voltage switchable dielectric material. Electrical current is allowed to flow from the second voltage switchable dielectric material, and the first electrically conductive material is deposited on the second voltage switchable dielectric material.

In some aspects, a second voltage difference, greater than the first characteristic voltage, may be created between the first source and the first voltage switchable dielectric material, and the first electrically conductive material may be deposited on the first voltage switchable dielectric material while it is subject to the second voltage difference.

Voltage switchable dielectric materials may be disposed on one or more substrates, and in some cases, a substrate may be flexible.

Some aspects include masking a portion of a voltage switchable dielectric material, such that the masked portion is not exposed to the first source. In some cases, the first electrically conductive material is deposited on an unmasked region of the first voltage switchable dielectric material.

Various aspects include a body comprising a voltage switchable dielectric material and a conductive material deposited on the voltage switchable dielectric material using an electrochemical process. In some cases, the conductive material is deposited using electroplating.

Aspects include a body comprising a first conductor, a second conductor, and a voltage switchable dielectric material separating the first and second conductor. In some cases, the voltage switchable dielectric material includes a current-carrying formation that electrically connects the first and second conductors. Some current-carrying formations include a via. Some current-carrying formations are fabricated using an electrochemical process.

Various aspects include bodies comprising RFID cards, smart cards, printed wiring boards, flex circuits, wafers, and printed circuit boards.

BRIEF DESCRIPTION OF FIGURES

FIG. 3A illustrates a step for forming a substrate of voltage switchable dielectric material.

FIG. 3B illustrates a step of depositing a non-conductive layer on the substrate.

FIG. 3C illustrates a step of patterning a non-conductive layer on the substrate.

FIG. 3D illustrates a step of forming a conductive layer using the pattern of the non-conductive layer.

FIG. 3E illustrates a step of removing the non-conductive layer from the substrate.

FIG. 3F illustrates the step of polishing the conductive layer on the substrate.

DETAILED DESCRIPTION

Figure 1:
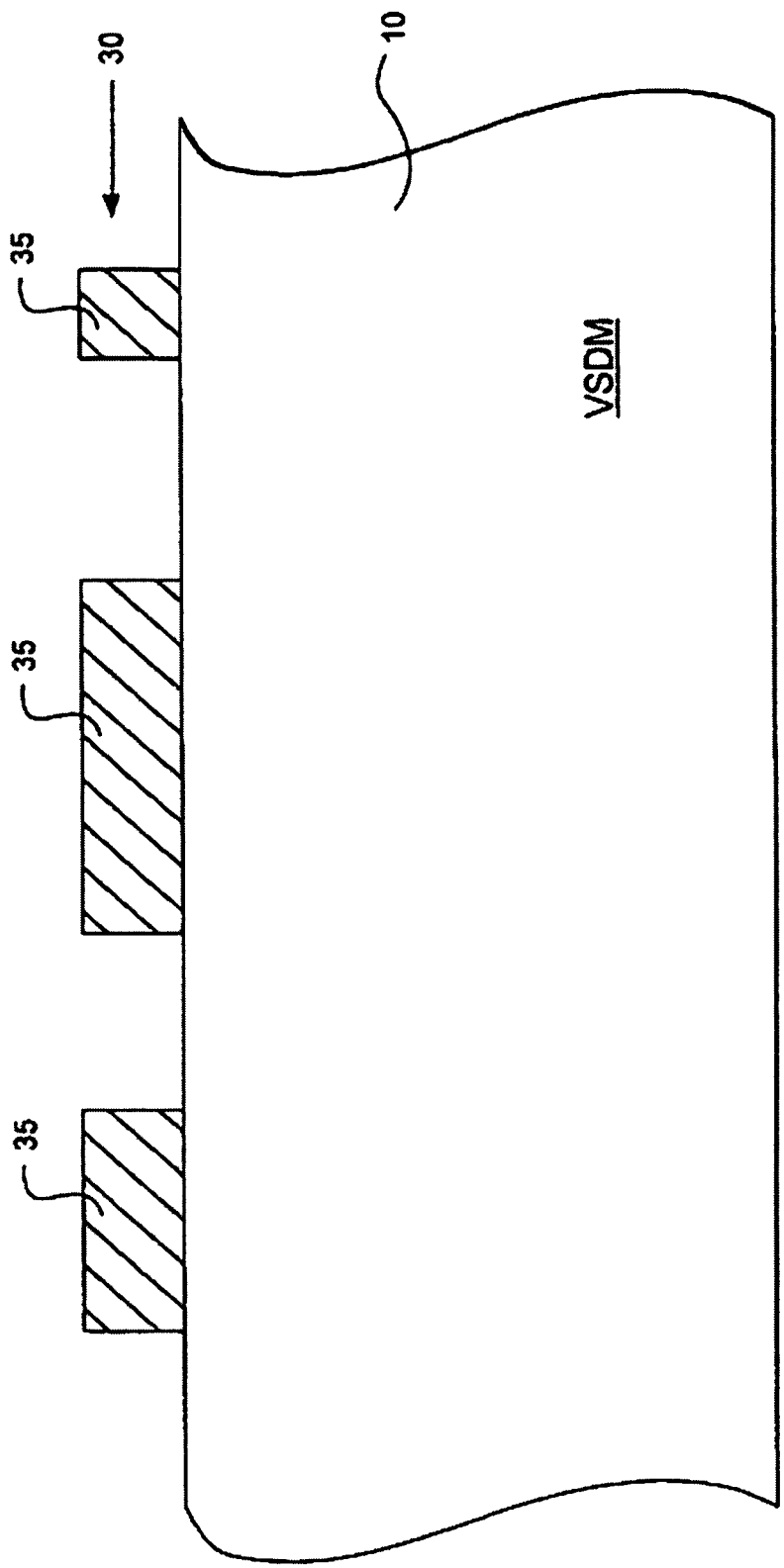
FIG. 1 illustrates a single-sided substrate device including a voltage switchable dielectric material, under an embodiment of the invention.

Embodiments of the invention use a class of material, referred to herein as voltage switchable dielectric materials, to develop current-carrying elements on a structure or substrate. The electrical resistivity of a voltage switchable dielectric material can be varied between a non-conductive state and a conductive state by an applied voltage. Methods of the invention render the substrate or structure conductive by applying a voltage to the voltage switchable dielectric material, then subject the substrate or structure to an electrochemical process. This process causes current-carrying material to be formed on the substrate. The current-carrying materials can be deposited on select regions of the substrate to form a patterned current-carrying layer. The applied voltage is then removed so that the substrate or structure returns to the non-conductive state after the current-carrying layer has been patterned. As will be further described, embodiments of the invention provide significant advantages over previous devices having current-carrying structures. Among other advantages, current-carrying material can be patterned onto the substrate with fewer steps, thus avoiding costly and time-consuming steps such as etching and electroless processes.

Voltage switchable dielectric materials may also be used for dual-sided and multi-substrate devices having two or more substrate surfaces containing electrical components and circuitry. Vias in substrates formed from voltage switchable dielectric materials can interconnect electrical components and circuitry on different substrate surfaces. A via can include any opening of a substrate or device that can be provided with a conductive layer for the purpose of electrically interconnecting two or more substrate surfaces. Vias include voids, openings, channels, slots, and sleeves that can be provided with a conductive layer to interconnect electrical components and circuitry on the different substrate surfaces. Under embodiments of the invention, plating a via can be accomplished during a relatively simple electrochemical process. For example, vias in a voltage switchable dielectric material substrate may be plated using an electrolytic process. The vias can also be formed concurrently during the electrolytic process used to pattern one or more conductive layers on a substrate surface or surfaces of the device.

In an embodiment of the invention, a current-carrying structure is formed from a voltage switchable dielectric material. A current-carrying formation can be formed on a plurality of selected sections of a surface of the substrate. As used herein, "current carrying" refers to an ability to carry current in response to an applied voltage. Examples of current-carrying materials include magnetic and conductive materials. As used herein, "formed" includes causing the current-carrying formation to form through a process in which a current-carrying material is deposited in the presence of a current applied to the substrate. Accordingly, current-carrying material may be electrodeposited onto the surface of the substrate through processes such as electroplating, plasma deposition, vapor deposition, electrostatic processes, or hybrids thereof. Other processes may also be used to form the current-carrying formation in the presence of an electrical current. The current-carrying formation may be incrementally formed so that a thickness of the current-carrying formation is developed by deposition of like material onto selected sections of the substrate.

An electrobonding interface is formed between the current-carrying formation and the substrate. The electrobonding interface comprises an interface layer of electrobonds between the current-carrying formation and the substrate. The electrobonds are bonds formed between molecules of the substrate and molecules of the current-carrying material that are electrodeposited onto the substrate. The electrobonds form in regions of the substrate where additional current-carrying material is deposited to form the current-carrying formation.

Inasmuch as electrobonds form between molecules, electrobonds exclude bonds formed as a result of electroless processes where molecules of the current-carrying material may be mechanically or otherwise added to the surface. Electrobonds exclude bonds formed in processes that include, for example, seeding conductive material onto the substrate using adhesives and other types of mechanical or chemical bonds. Examples of processes where current-carrying material may be electrodeposited to form electrobonds include electroplating, plasma deposition, electrostatic processes, and hybrids thereof.

A nonconductive layer may be patterned onto the surface of the substrate to define the selected sections of the substrate. The substrate is then subjected to an electrochemical process to incrementally form the current-carrying formation on the selected regions of the substrate. The non-conductive layer may comprise a resist layer that is removed once the current-carrying formation is formed on the select regions of the substrate. The non-conductive layer can also be formed from screened resist patterns, which can either be permanent or removable from the substrate.

A voltage switchable dielectric material is a material that is non-conductive until a voltage is applied that exceeds a characteristic threshold voltage value. Above the characteristic threshold voltage value the material becomes conductive. Therefore, a voltage switchable dielectric material is switchable between a non-conductive state and a conductive state.

An electrochemical process includes a process in which conductive elements are bonded to a voltage switchable dielectric material while the voltage switchable dielectric material is in the conductive state. An example of an electrochemical process is an electrolytic process. In an embodiment, an electrode is immersed in a fluid along with another material. A voltage is applied between the electrode and the other material to cause ions from the electrode to transfer and form on the other material.

In one embodiment, a device includes a single-sided substrate formed from voltage switchable dielectric material. A non-conductive layer is patterned onto the substrate to define regions on the surface of substrate. Preferably, the substrate is subjected to an electrolytic process when the voltage switchable dielectric material is in a conductive state. The electrolytic process causes conductive material to incrementally form on the substrate in the regions defined by the pattern of the non-conductive layer. One advantage of this embodiment is that the current-carrying formation can be fabricated on the structure with a reduced thickness relative to previous substrate devices. Also, the patterned current-carrying formation can be formed without implementing some fabrication steps used with prior art structures, such as, for example, steps of etching, or multiple steps of masking, imaging, and developing resist layers.

In another embodiment of the invention, a dual-sided substrate is formed to include vias to electrically connect components on both sides of the substrate. A patterned current-carrying layer is formed on each side of the substrate. One or more vias extend through the substrate. The substrate can be subjected to one or more electrochemical processes while in the conductive state, causing current-carrying material to be formed on selected sections of the substrate, including on surfaces defining the vias. The selected sections of the substrate can be defined by a non-conductive layer, patterned in a previous step.

Several shortcomings exist in previous processes that plate or otherwise provide conductive layers to surfaces of vias. In previous processes that deposit seed layers on surfaces of vias and then subject those surfaces to an electroplating process, the plating material bonds only to the particles that comprise the seed layer. Seeding conductive particles can be problematic and costly, since it requires additional manufacturing steps. Further, the continuity and dispersion of the particles along surfaces defining the vias is often imperfect. As such, a substantial risk exists that the continuity of the plating is broken at some juncture of a surface of a via.

Other previous processes use adhesives to form mechanical bonds between surfaces, or between particles in the surface of a via and a conductive material. The mechanical bonds are relatively weak in comparison to electrochemical bonds formed on surfaces of the substrate. The mechanical nature of the bonds formed between the surface of the via and the conductive material make devices prone to failure. To compound problems with previous devices, a failed plated via is detrimental to the entire substrate device.

Typically, vias are plated only after the substrate is provided with conductive elements on the substrate's surfaces. Failures in the plated vias may not be noticed or caused until at least some or all of the substrates in the device are assembled together. If plating a via fails, re-plating the via is not feasible in the assembled device. Often, the entire device has to be discarded. Thus, one failed via in a device having several vias and substrates is enough to cause the entire device, including all of the fabricated substrates, to be discarded.

Among other advantages of this embodiment, problematic methods for forming current-carrying formations on surfaces defining vias are avoided. According to prior art methods that require a surface modification to be conductive, additional materials are required to prepare vias to bond with a conductive material because the surfaces of the vias are not otherwise conductive without these materials. Thus, additional materials are not needed in embodiments of the invention because the voltage switchable dielectric material forming the substrate can be made conductive during the electroplating process. As such, bonds formed between surfaces of vias and the current-carrying material are electrical attraction bonds formed during the electrochemical process. The bond, herein referred to as an electrochemical bond, is stronger than bonds formed by seeded particles or adhesives. Moreover, the surfaces of the vias are uniformly surfaces of a voltage switchable dielectric material. Thus, electrical continuity through the vias is ensured.

In another embodiment of the invention, a multi-substrate device includes two or more substrates each formed from a voltage switchable dielectric material. Each substrate can be subjected to an electrochemical process to form a conductive layer. A pattern of each conductive layer is predetermined by patterning a non-conductive layer to define the pattern for the current-carrying formation. One or more vias may be used to electrically connect current-carrying formations on one or more of the substrates. Each via may be formed when the respective substrates are subjected to the electrochemical process.

Among other advantages provided by embodiments of the invention, multi-substrate devices use the conductive state of the voltage switchable dielectric material to plate vias interconnecting the different substrate surfaces. Therefore, current-carrying materials can be formed on vias during an electrolytic processes without having to alter the substrate in regions that define the vias. The resulting current-carrying layers formed in the vias significantly reduce the risk that the vias will fail to establish electrical contact between substrates. In contrast, prior art multi-substrate devices have been plagued by occasionally ineffective vias, which often resulted in the entire multi-substrate device having to be discarded.

Another advantage provided to embodiments of the invention is that inclusion of a substrate formed from a voltage switchable dielectric material also provides voltage regulation protection to the device as a whole. Numerous applications for embodiments of the invention exist. Embodiments of the invention may be employed for use with, for example, substrate devices such as PCBs, surface mount components, pin connectors, smart cards, and magnetically layered materials.

A. Single Substrate Devices

FIG. 1 is a cross-sectional view of a device incorporating a voltage switchable dielectric material, under an embodiment of the invention. In this embodiment, the voltage switchable dielectric material is used to form a substrate 10 of the device. The voltage switchable dielectric material is non-conductive but, as previously noted, can be switched to a conductive state by applying a voltage having a magnitude that exceeds a characteristic voltage of the material. Numerous examples of a voltage switchable dielectric material have been developed, including those described below with reference to FIG. 2. Applications in which current-carrying substrates are used include, for example, printed circuit boards (PCBs), printed wiring boards, semiconductor wafers, flex circuit boards, backplanes, and integrated circuit devices. Specific applications of integrated circuit include devices having computer processors, computer readable memory devices, motherboards, and PCBs.

The voltage switchable dielectric material in the substrate 10 allows for the fabrication of a patterned current-carrying formation 30. The current-carrying formation 30 is a combination of individual current-carrying elements 35 formed onto the substrate 10 according to a predetermined pattern. The current-carrying formation 30 includes conductive materials. The current-carrying formation 30 is formed from precursors deposited on the substrate 10 during an electrochemical process in which the voltage switchable dielectric material is rendered conductive by an applied voltage (see FIG. 2). In an embodiment, the precursors are ions deposited from an electrode into a solution. The substrate 10 is exposed to the solution while the voltage switchable dielectric material is maintained in the conductive state.

The precursors selectively deposit on the substrate 10 according to a predetermined pattern. The predetermined pattern is formed by patterning a non-conductive layer 20 such as a resist layer (see FIGS. 3B-3D). When the voltage switchable dielectric material is in the conductive state, the precursors deposit only on the exposed regions of the substrate 10. The voltage switchable dielectric material in the conductive state can form electrochemical bonds with the precursors in the exposed sections of the substrate 10. In an embodiment, the non-conductive layer 20 (FIGS. 3B-3D) is formed from a resist layer deposited over the substrate 10. The resist layer is then masked and exposed to create the pattern, as is well known.

Figure 2:
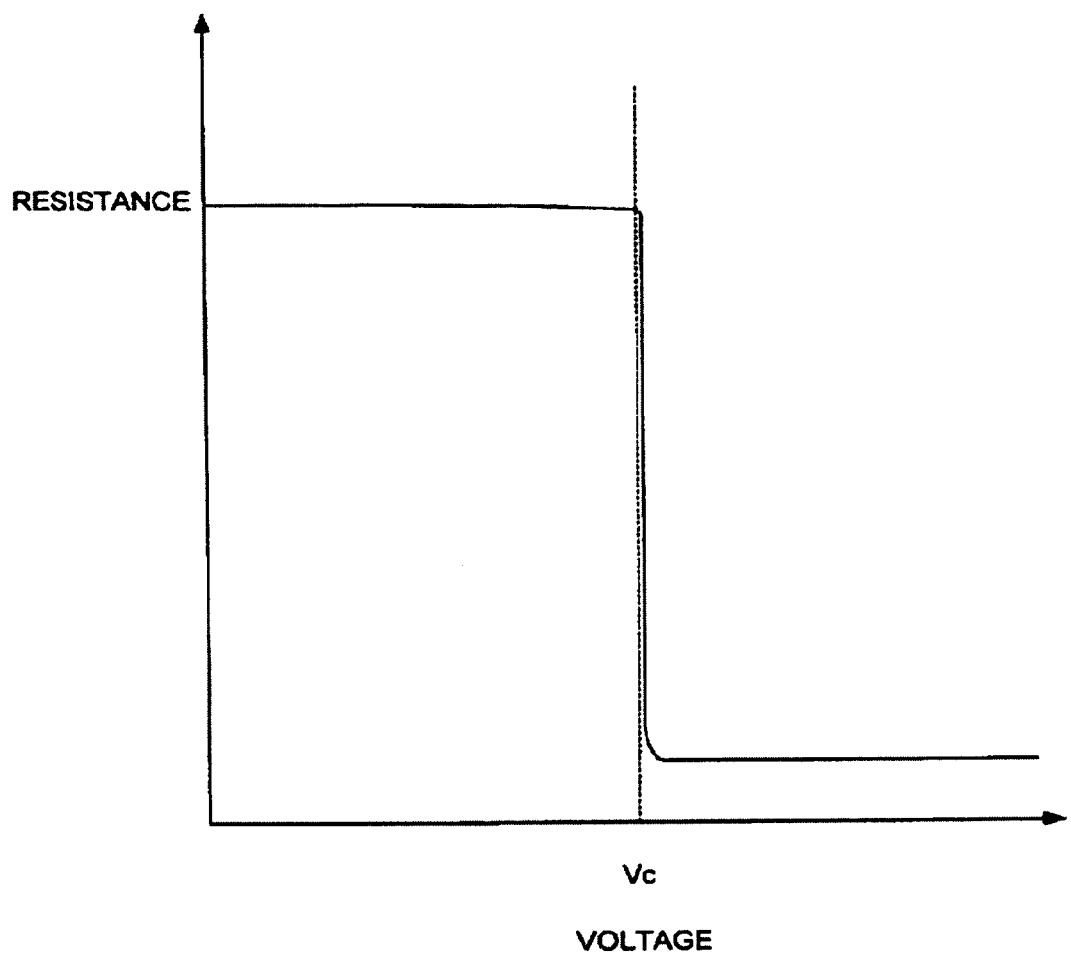
FIG. 2 illustrates electrical resistance characteristics of a voltage switchable dielectric material, under an embodiment of the invention.

FIG. 2 illustrates the resistive properties of voltage switchable dielectric materials as a function of applied voltage. The voltage switchable dielectric materials that can be used to form the substrate have a characteristic voltage value (Vc) specific to the type, concentration, and particle spacing of the material's formulation. A voltage (Va) can be applied to the voltage switchable dielectric material to alter the electrical resistance properties of the material. If the magnitude of Va ranges between 0 and Vc, the voltage switchable dielectric material has a high electrical resistance and is therefore non-conductive. If the magnitude of Va exceeds Vc, the voltage switchable dielectric material transforms into a low electrical resistance state in which it is conductive. As shown by FIG. 2, the electrical resistance of the substrate preferably switches sharply from high to low, so that the transformation between states is immediate.

In an embodiment, Vc ranges between 1 and 100 volts to render the voltage switchable dielectric material conductive. Preferably, Vc is between 5 and 50 volts, using one of the compositions for voltage switchable dielectric material listed below. In an embodiment, a voltage switchable material is formed from a mixture comprising conductive particles, filaments, or a powder dispersed in a layer including a non-conductive binding material and a binding agent. The conductive material may comprise the greatest proportion of the mixture. Other formulations that have the property of being non-conductive until a threshold voltage is applied are also intended to be included as voltage switchable dielectric material under embodiments of this invention.

A specific example of a voltage switchable dielectric material is provided by a material formed from a 35% polymer binder, 0.5% cross linking agent, and 64.5% conductive powder. The polymer binder includes Silastic 35U silicone rubber, the cross-linking agent includes Varox peroxide, and the conductive powder includes nickel with a 10 micron average particle size. Another formulation for a voltage switchable material includes 35% polymer binder, 1.0% cross linking agent, and 64.0% conductive powder where the polymer binder, the cross-linking agent, and the conductive powder are as described above.

Other examples of conductive particles, powders, or filaments for use in a voltage switchable dielectric material can include aluminum, beryllium, iron, silver, platinum, lead, tin, bronze, brass, copper, bismuth, cobalt, magnesium, molybdenum, palladium, tantalum carbide, boron carbide, and other conductive materials known in the art that can be dispersed within a material such as a binding agent. The non-conductive binding material can include organic polymers, ceramics, refractory materials, waxes, oils, and glasses, as well as other materials known in the art that are capable of inter-particle spacing or particle suspension. Examples of voltage switchable dielectric material are provided in references such as U.S. Pat. Nos. 4,977,357, 5,068,634, 5,099,380, 5,142,263, 5,189,387, 5,248,517, 5,807,509, WO 96/02924, and WO 97/26665, all of which are incorporated by reference herein. The present invention is intended to encompass modifications, derivatives, and changes to any of the references listed above or below.

Another example of a voltage switchable dielectric material is provided in U.S. Pat. No. 3,685,026, incorporated by reference herein, which discloses finely divided conductive particles disposed in a resin material. Yet another example of voltage switchable dielectric material is provided in U.S. Pat. No. 4,726,991, incorporated by reference herein, which discloses a matrix of separate particles of conductive materials and separate particles of a semiconductor material coated with an insulative material. Other references have previously incorporated voltage switchable dielectric materials into existing devices, such as disclosed in U.S. Pat. No. 5,246,388 (connector) and U.S. Pat. No. 4,928,199 (circuit protection device), both of which are incorporated by reference herein.

FIGS. 3A-3F illustrate a flow process for forming a single layer current-carrying structure on a substrate as shown in FIG. 1, under an embodiment of the invention. The flow process exemplifies a process in which the electrical properties of a voltage switchable dielectric material are used to develop a current-carrying material according to a predetermined pattern.

Figure 3A:
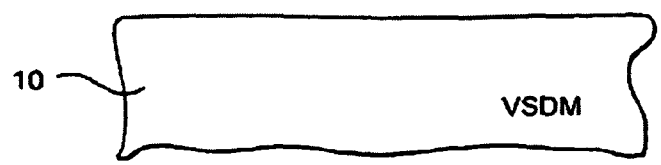
FIGS. 3A-3F show a flow process for forming the device of FIG. 1.

In FIG. 3A, a substrate 10 is provided that is formed from a voltage switchable dielectric material. The substrate 10 has dimensions, shape, composition and properties as necessary for a particular application. The composition of the voltage switchable dielectric material can be varied so that the substrate is rigid or flexible, as required by the application. In addition, the voltage switchable dielectric material can be shaped for a given application. While some embodiments described herein disclose essentially planar substrates, other embodiments of the invention may employ a voltage switchable dielectric material that is molded or shaped into a non-planar substrate, such as for use with connectors and semi-conductor components.

Figure 3B:
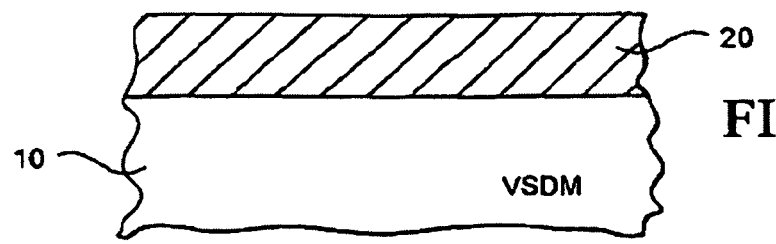
Figure 3C:
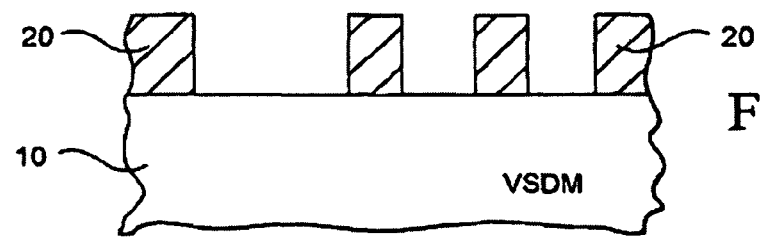

In FIG. 3B, a non-conductive layer 20 is deposited over the substrate 10. The non-conductive layer 20 can be formed from a photoimageable material, such as a photoresist layer. Preferably, the non-conductive layer 20 is formed from a dry film resist. FIG. 3C shows that the non-conductive layer 20 is patterned on the substrate 10. In an embodiment, a mask is applied over the non-conductive layer 20. The mask is used to expose a pattern of the substrate 10 through a positive photoresist. The pattern of the exposed substrate 10 corresponds to a pattern in which current-carrying elements will subsequently be formed on the substrate 10.

Figure 3D:
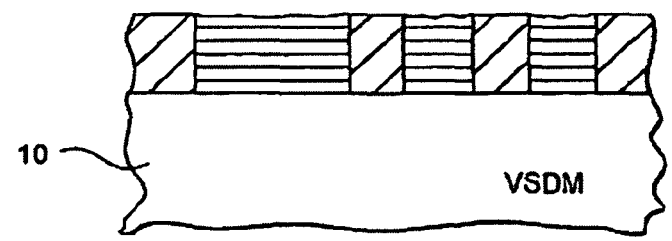

FIG. 3D shows that the substrate 10 subjected to an electrolytic process while the voltage switchable dielectric material is maintained in a conductive state. The electrolytic process forms a current-carrying formation 30 that includes current-carrying elements 35. In an embodiment, the electroplating process deposits current-carrying elements 35 on the substrate 10 in gaps 14 in the non-conductive layer 20 created by masking and exposing the photoresist. Additional details of the electrolytic process as employed under an embodiment of the invention are described with FIG. 4.

Figure 3E:
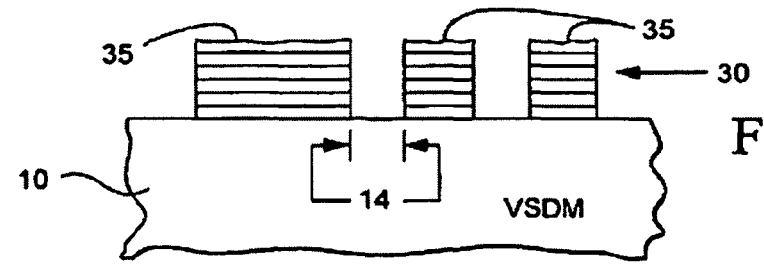
Figure 3F:
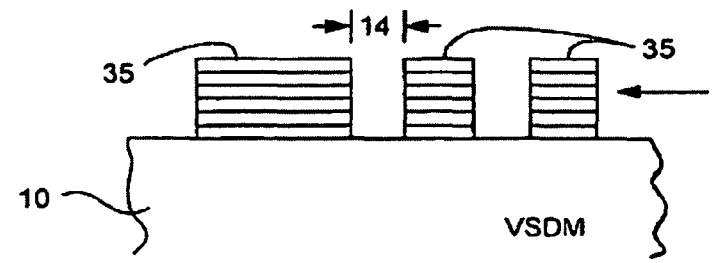

In FIG. 3E, the non-conductive layer 20 is removed as necessary from the substrate 10. In an embodiment in which the non-conductive layer 20 includes photoresist, the photoresist is stripped from the surface of the substrate 10 using a base solution, such as a potassium hydroxide (KOH) solution. Still, other embodiments may employ water to strip the resist layer. In FIG. 3F, the resulting conductive layer 30 patterned onto the substrate 10 is polished. An embodiment employs chemical-mechanical polishing (CMP) means.

Figure 4:
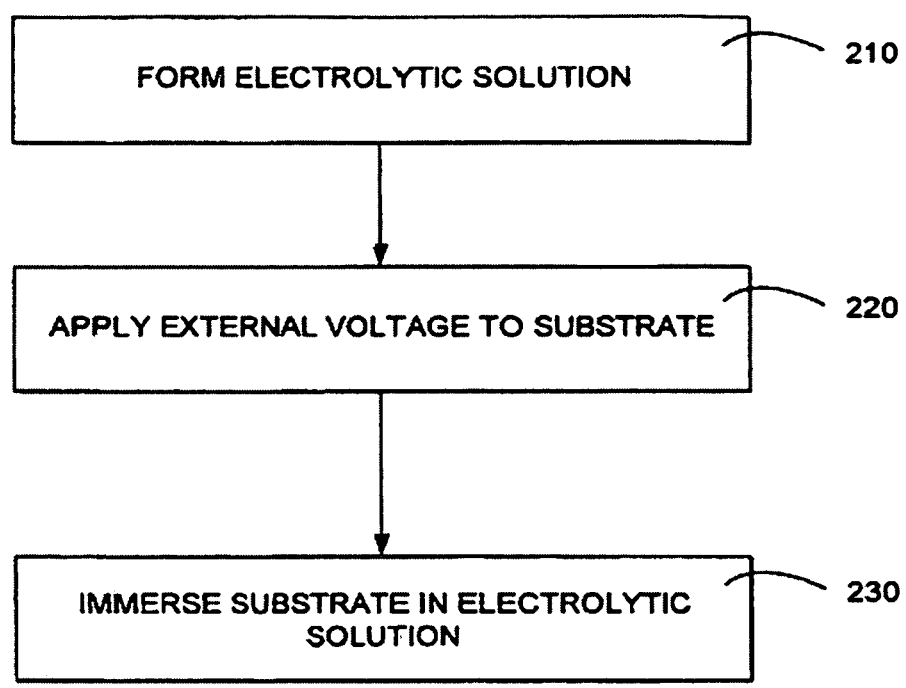
FIG. 4 details a process for electroplating current-carrying structures on a substrate formed from voltage switchable dielectric material, under an embodiment of the invention.

FIG. 4 details the development of current-carrying elements on the substrate by use of an electroplating process. In a step 210, the electroplating process includes forming an electrolytic solution. The composition of the current-carrying elements depends on the composition of an electrode used to form the electrolytic solution. Accordingly, the composition of the electrode is selected according to factors such as cost, electrical resistance, and thermal properties. Depending on the application, for example, the electrode can be gold, silver, copper, tin, or aluminum. The electrode can be immersed in a solution including, for example, sulfate plating, pyrophosphate plating, and carbonate plating.

In a step 220, a voltage that exceeds the characteristic voltage of the voltage switchable dielectric material is applied to the substrate 10 while the substrate 10 is immersed in the electrolytic solution. The substrate 10 switches to a conductive state, such as is illustrated by FIG. 2. The applied voltage makes the substrate 10 conductive, causing precursors in the electrolytic solution to bind to the voltage switchable dielectric material.

In a step 230, ions from the electrolytic solution bond to the substrate 10 in areas of the substrate 10 that are exposed by the non-conductive layer 20. In an embodiment, ions are precluded from bonding to regions where the photoresist has been exposed and developed. Therefore, the pattern of conductive material formed on the substrate 10 matches the positive mask used to pattern the non-conductive layer 20. Exposed regions of the substrate 10 attract and bond to the ions, in some embodiments, because the substrate is maintained at a voltage relative to the electrode so that the substrate, the electrode, and the electrolytic solution together comprise an electrolytic cell, as in well known.

Among advantages provided by an embodiment of the invention, current-carrying elements 35 are patterned onto the substrate 10 in a process requiring fewer steps than prior art processes. For example, in an embodiment, current-carrying elements 35 are deposited to form circuitry on the substrate 10 without etching, and therefore also without deposition of a buffer or masking layer for an etching step. In addition, embodiments of the invention allow for the current-carrying elements 35 to be formed directly on the substrate 10 instead of on a seed layer. This allows a vertical thickness of the current-carrying elements 35 to be reduced relative to that in similar devices formed by other processes.

B. Devices Having Dual-Sided Substrates

Certain devices include substrates that employ electrical components on two or more sides. The number of current-carrying elements that can be retained on a single substrate increases when two sides are used. As such, dual-sided substrates are often used when a high-density distribution of components are desired. Dual-sided substrates include, for example, PCBs, printed wiring boards, semiconductor wafers, flex circuits, backplanes, and integrated circuit devices. In such devices, vias or sleeves are typically used to interconnect both planar sides of the substrate. The vias or sleeves establish an electrical connection between the current-carrying elements on each planar side of the substrate.

Figure 5:
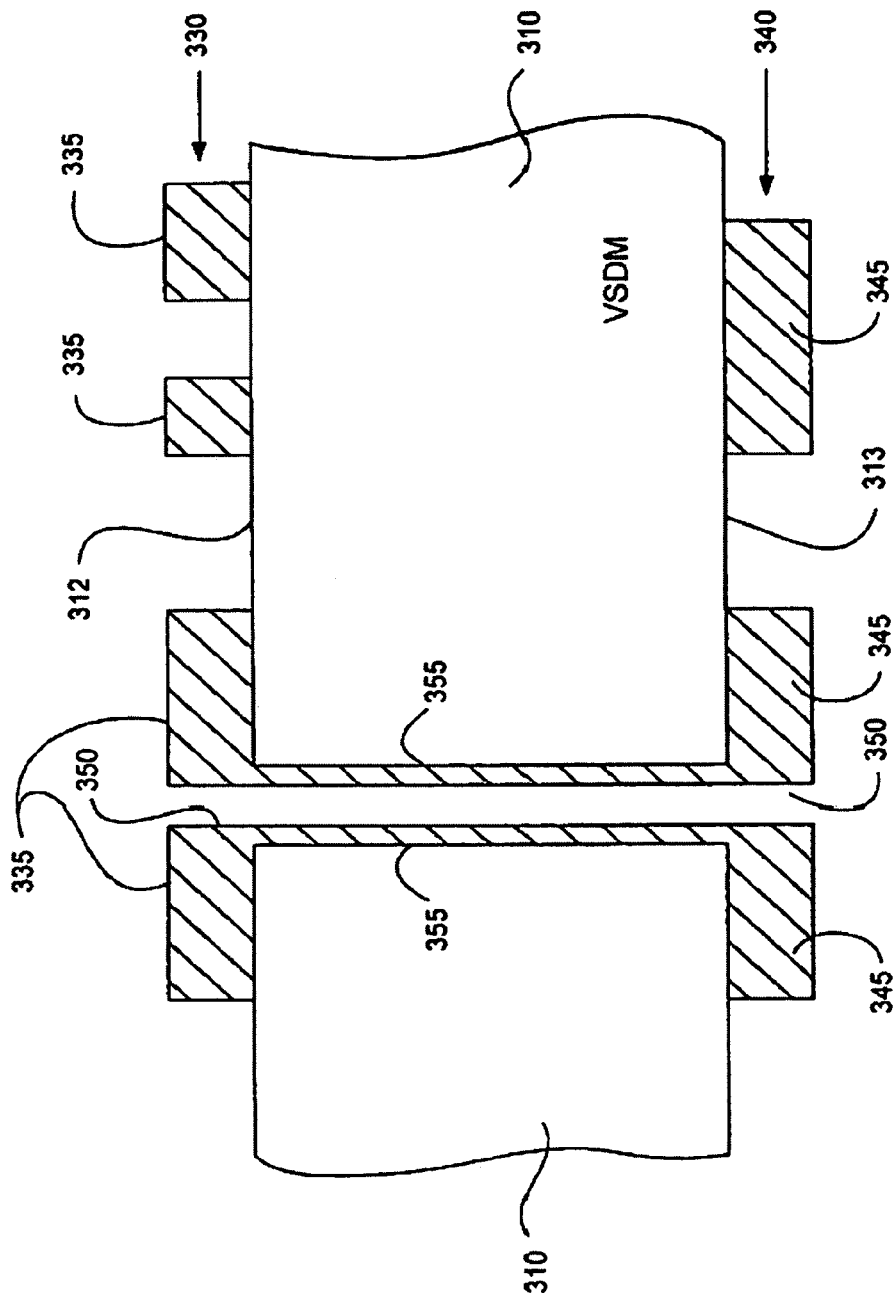
FIG. 5 illustrates a dual-sided substrate device formed from voltage switchable dielectric material and including a via interconnecting current-carrying formations on both sides of the substrate, under an embodiment of the invention.

FIG. 5 displays an embodiment in which a device includes a dual-sided substrate 310 having one or more plated vias 350. The vias 350 extend from a first planar surface 312 of the substrate to a second planar surface 313 of the substrate. The first surface 312 includes a current-carrying formation 330 having a plurality of current-carrying elements 335. The second surface 313 includes a current-carrying formation 340 having a plurality of current-carrying elements 345. The current-carrying formations 330, 340 are fabricated on the respective sides 312, 313 of the substrate 310 by an electrochemical process. In an embodiment, an electrolytic process is used to form a solution of precursors that are deposited on the respective first or second surface of the substrate when a voltage switchable dielectric material is in a conductive state. The precursors deposit on the substrate 310 according to a pattern of a pre-existing non-conductive layer on the respective first or second surface 312, 313.

In an embodiment, a via 350 is formed in the substrate 310 before the substrate is subjected to the electrolytic process. Each side 312, 313 of the substrate 310 includes a patterned non-conductive layer (not shown). In an embodiment, the patterned non-conductive layers are photoresist layers that are patterned to expose select regions on the first and second side 312, 313 of the substrate 310. The via 350 is positioned so that a plated surface of the via 350 subsequently contacts one or more of the current-carrying elements 335, 345 on the first and second side 312, 313. During the electrolytic process, the via 350 is plated while current-carrying formations 330 and 340 are fabricated. In this way the via 350 is provided with a conductive sleeve or side-wall 355 to extend an electrical connection from one of the current-carrying elements 335 on the first surface 312 with one of the current-carrying elements 345 on the second side 313 of the substrate 310.

Figure 6:
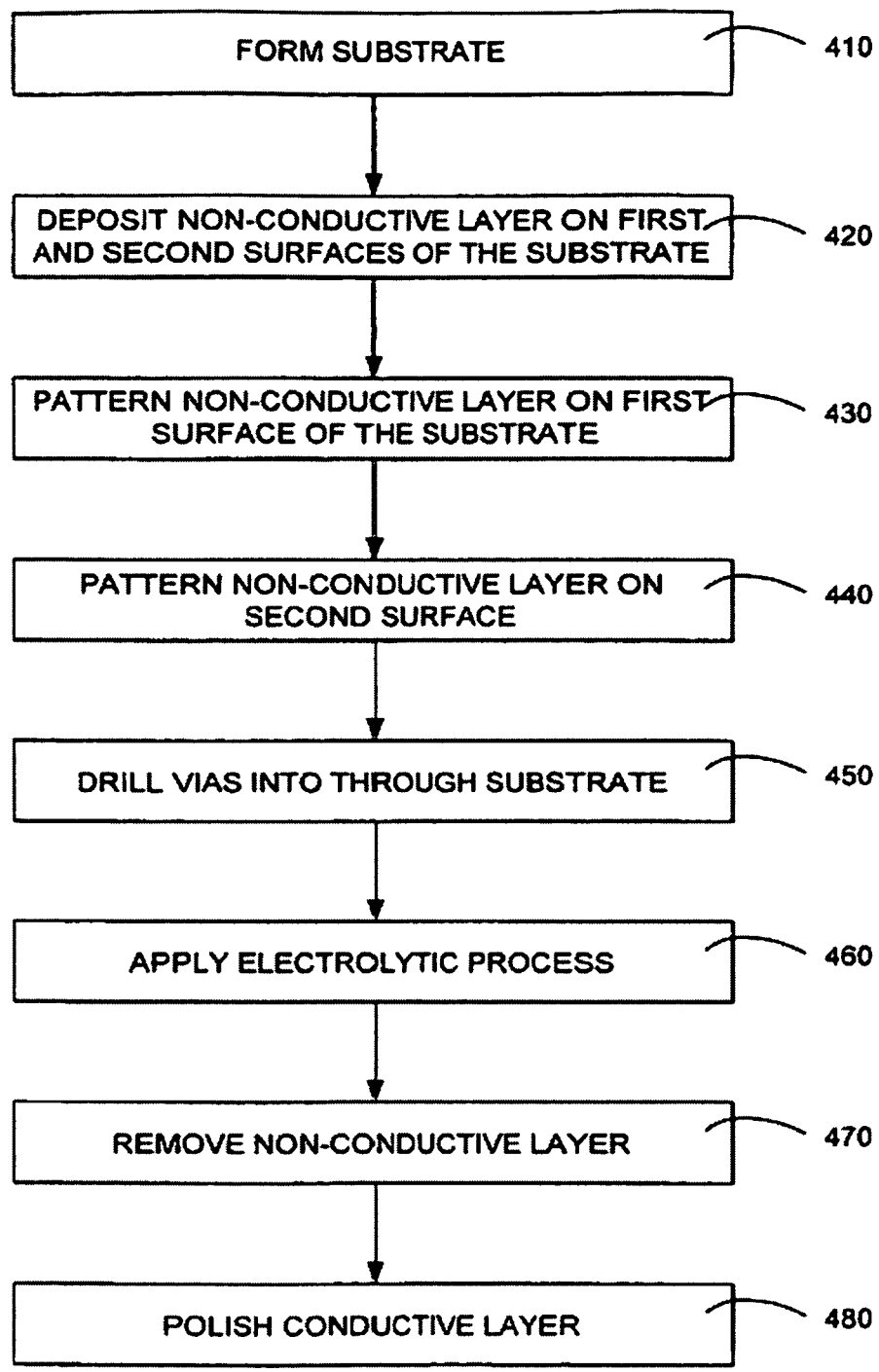
FIG. 6 illustrates a flow process for forming the device of FIG. 5.

FIG. 6 displays a flow process for developing a dual-sided substrate 310, according to an embodiment of the invention. In a step 410, the substrate 310 is formed from a voltage switchable dielectric material and provided with dimensions, shape, properties, and characteristics necessary for a desired application. In a step 420, a non-conductive layer 320 is deposited over the first and second side 312, 313 of the substrate 310. In a step 430, the non-conductive layer 320 is patterned on the first side 312 of the substrate 310. Preferably, non-conductive material on at least the first side 312 of the substrate 310 is a photo-imageable material, such as a photoresist that is patterned using a positive mask. The positive mask allows select regions of the substrate 310 to be exposed through the non-conductive layer 320. In a step 440, the non-conductive layer 320 is patterned on the second side 313 of the substrate 310. In an embodiment, the non-conductive layer 320 on the second side 313 of the substrate 310 is similarly also a photoresist that is subsequently masked and exposed to form another pattern. The resulting pattern exposes the substrate 310 through the photoresist layer.

In a step 450, one or more vias 350 are formed through the substrate 310. On each side 312, 313 of the substrate 310, the vias 350 intersect an uncovered portion of the substrate 310. The vias 350 are defined by side-walls formed through the substrate 310. In a step 460, the substrate 310 is subjected to one or more electrolytic processes to plate the first side 312, second side 313, and the side-walls of the vias 350. In an embodiment, in step 460 the substrate 310 is subjected to a single electrolytic process while an external voltage is applied to the voltage switchable dielectric material so that the substrate is in a conductive state. The conductive state of the substrate 310 causes ions in the electrolytic solution to bond to the substrate 310 in uncovered regions on the first and second surfaces 312, 313. The electrolytic fluid also moves through the vias 350 so that ions bond to the side-walls of the vias 350, forming conductive sleeves 355 that extend through the vias 350. The vias 350 intersect current-carrying elements on the first and second sides 312, 313 to electrically connect the current-carrying formation 330 on the first side 312 with the current-carrying formation 340 on the second side 313.

The non-conductive layer 320 is removed as necessary from the substrate in a step 470. In an embodiment in which the non-conductive layer 320 includes photoresist, the photoresist is stripped from the surface of the substrate 310 using a base solution, such as a KOH solution. In a step 480, the resulting current-carrying formation 330 and/or 340 is polished. In an embodiment, CMP is employed to polish the current-carrying formation 330.

Several variations can be made to the embodiment described with reference to FIGS. 5 and 6. In one variation, a first non-conductive layer can be deposited on the first surface 312, and a second non-conductive layer can be deposited on the second surface 313 in a separate step. The first and second non-conductive layers can be formed from different materials, and can provide different functions other than enabling patterns to be formed for plating the substrate. For example, the first non-conductive material can be formed from a dry resist, while the second non-conductive material can be formed from a photo-imageable insulative material. While the dry resist is stripped away after a current-carrying layer is formed on the first side 312, the photo-imageable insulative material is permanent and retained on the second surface 313.

Additionally, different plating processes can be used to plate the first surface 312, the second surface 313, and the surface 355 of the vias 350. For example, the second surface 313 of the substrate 310 can be plated in a separate step from the first surface 312 to allow the first and second surfaces 312, 313 to be plated using different electrodes and/or electrolytic solutions. Since embodiments of the invention reduce steps necessary to form current-carrying layers, forming current-carrying layers 330 and 340 on the dual-sided substrate 310 is particularly advantageous. The use of different plating processes facilitates the fabrication of different materials for the current-carrying formations on opposite sides of the substrate 310. Different types of current-carrying material can be provided as simply as switching the electrolytic baths to include different precursors.

As one example, a first side of a device such as a PCB is intended to be exposed to the environment, but the opposite side requires a high-grade conductor. In this example, a nickel pattern can be plated on the first side of the substrate, and a gold pattern can be plated on the second side of the substrate. This enables the PCB to have a more durable current-carrying material on the exposed side of the PCB.

Any number of vias can be drilled, etched, or otherwise formed into the substrate. Vias can interconnect current-carrying elements, including electrical components or circuitry. Alternatively, a via can be used to ground a current-carrying element on one side of the substrate to a grounding element accessible from a second side of the substrate.

Among advantages included with dual-sided substrates under an embodiment of the invention, precursors from the electrode form an electrochemical bond to the surfaces of the vias 350. The vias 350 are therefore securely plated, with minimal risks of a discontinuity that would interrupt electrical connection between the two sides of the substrate 310.

C. Devices Having Multi-Layered Substrates

Figure 7:
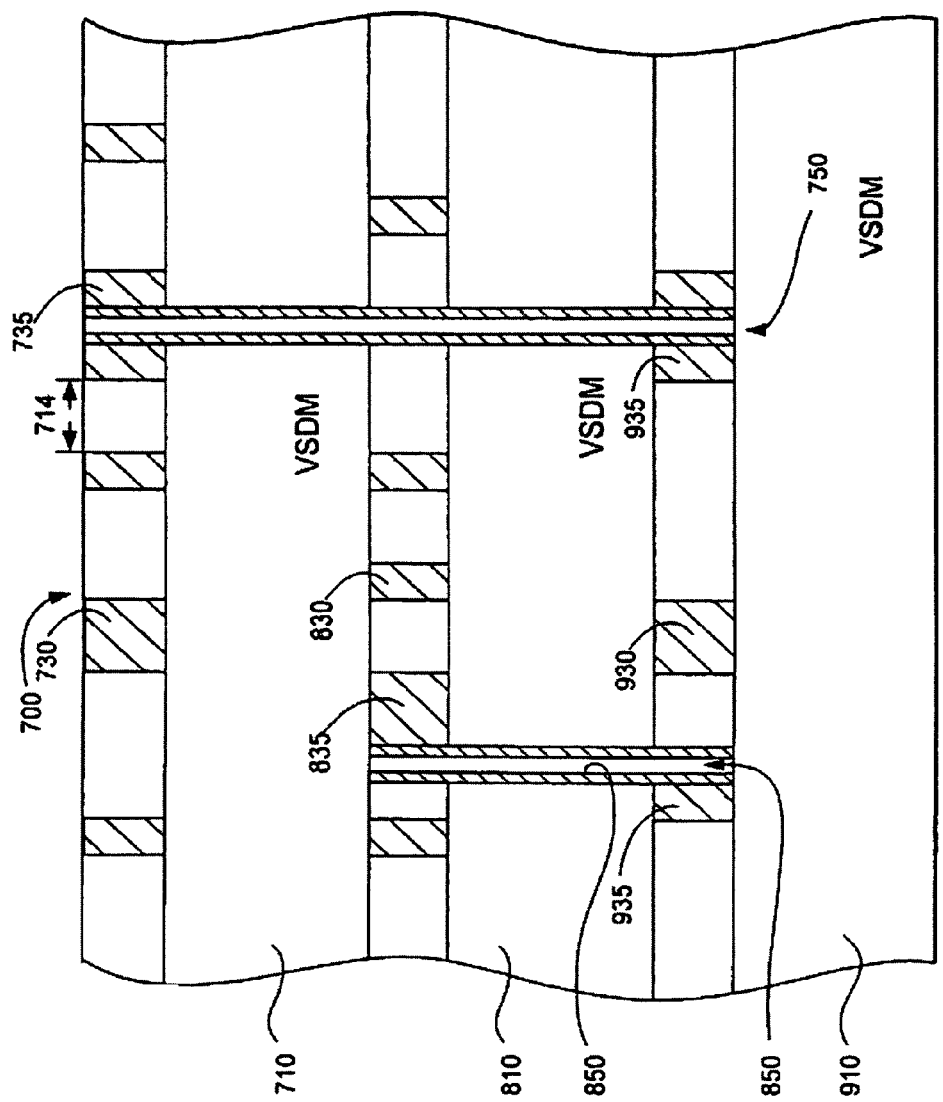
FIG. 7 illustrates a multi-layered substrate device including substrates formed from voltage switchable dielectric material, under an embodiment of the invention.

Some devices may include two or more substrates into one device. Stacking substrates enables the device to incorporate a high density of current-carrying elements, such as circuitry and electrical components, within a limited footprint. FIG. 7 illustrates a multi-substrate device 700. In the embodiment shown, the device 700 includes first, second and third substrates 710, 810, 910. Each substrate 710-910 is formed from a voltage switchable dielectric material. As with previous embodiments, the substrates 710-910 are non-conductive absent an applied voltage that exceeds the characteristic voltage of the voltage switchable dielectric material. While FIG. 7 illustrates an embodiment of three substrates, other embodiments may include more or fewer substrates. It will be appreciated that substrates may also be aligned in different configurations other than being stacked, such as adjacent or orthanormal to one another.

Each substrate 710, 810, 910 is provided with at least one current-carrying formation 730, 830, 930 respectively. Each current-carrying formation 730, 830, 930 is formed from a plurality of current-carrying elements 735, 835, 935 respectively. The current-carrying elements 735, 835, 935 are each formed when their respective substrates 710, 810, 910 are subjected to an electrochemical process while in a conductive state. Preferably, the substrates 710, 810, 910 are mounted on one another after the respective current-carrying layers 735, 835, 935 are formed.

The device 700 includes a first plated via 750 to electrically connect current-carrying elements 735 on the first substrate 710 to current-carrying elements 935 on the third substrate 910. The device 700 also includes a second plated via 850 to electrically connect current-carrying elements 835 on the second substrate 810 with current-carrying elements 935 on the third substrate 910. In this way, the current-carrying formations 730, 830, 930 of the device 700 are electrically interconnected. The arrangement of plated vias 750, 850 shown in the device 700 is only exemplary, as more or less vias can also be employed.

For example, additional vias can be used to connect one of the current-carrying elements 735, 835, 935 to any other of the current-carrying elements on another substrate. Preferably, the first and second plated vias 750, 850 are formed in the substrates 710, 810, 910 before the substrates 710, 810, 910 are individually plated. Thus, prior to plating, the plated vias 750, 850 are formed through the substrates 710, 810, 910 in predetermined positions so as to connect the current-carrying elements 735, 835, 935 of the different substrates as necessary. For the first plated via 750, openings are formed in the substrates 710, 810, 910 at the predetermined positions before any of the substrates are plated. Likewise, for the second plated via 850, openings are formed in the substrates 810, 910 at predetermined positions prior to those substrates being plated. The predetermined positions for the first and second plated via 750 and 850 correspond to uncovered regions on surfaces of the respective substrates in which current-carrying material will form. During subsequent electrolytic processes, precursors deposit in these uncovered regions of the substrates, as well as within the openings formed in each substrate to accommodate the vias 750, 850.

For simplicity, details of device 700 will be described with reference to the first substrate 710. The first substrate 710 includes gaps 714 between the current-carrying elements 735. In an embodiment, gaps 714 are formed by masking a photoresist layer and then removing remaining photoresist after the current-carrying elements 735 are fabricated on the substrate 710. Similar processes are used to form second and third substrates 810, 910. The first substrate 710 is mounted over the current-carrying formation 830 of the second substrate 810. As with the first substrate 710, the second substrate 810 is mounted directly over the current-carrying formation 930 of the third substrate 910.

In a variation to embodiments described above, one or more substrates in the device 700 may be dual-sided. For example, the third substrate 910 may be dual-sided, since the location of the third substrate 910 at the bottom of the device 700 readily enables the third substrate to incorporate a double-sided construction. Therefore, the device 700 may include more current-carrying formations than substrates to maximize the density of componentry and/or minimize the overall footprint of the device.

The composition of the substrates 710, 810, 910, as well as the particular current-carrying material used for each substrate, may vary from substrate to substrate. Thus, for example, the current-carrying formation of the first substrate 710 maybe formed from nickel, while the current-carrying formation 830 of the second substrate 810 is formed from gold.

Figure 8:
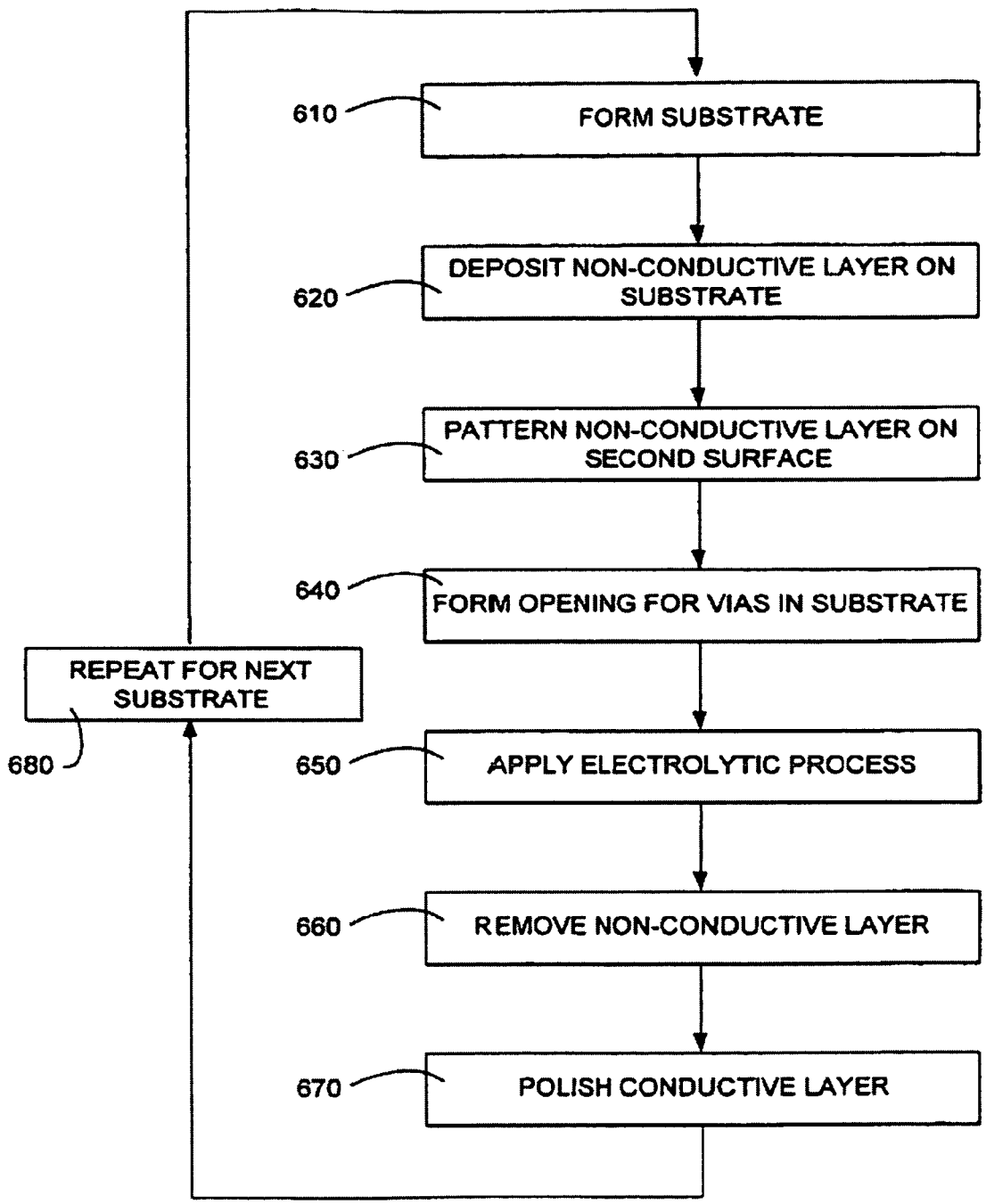
FIG. 8 illustrates a process for forming the multi-substrate device of FIG. 7.

FIG. 8 illustrates a flow process for developing a device having multi-layered substrates, such as the device 700, where two or more of the substrates are formed from a voltage switchable dielectric material. The device can be formed from a combination of single and/or double-sided substrates. In an embodiment, the multi-substrate device 700 comprises separately formed substrates having current-carrying formations. With reference to device 700, in a step 610, the first substrate 710 is formed from a voltage switchable dielectric material. In a step 620, a first non-conductive layer is deposited over the first substrate 710. As with previously described embodiments, the first non-conductive layer can be, for example, a photo-imageable material such as a photoresist layer. In a step 630, the first non-conductive layer is patterned to form selected regions in which the substrate 710 is exposed. In an embodiment, a photoresist layer is masked and then exposed to form the pattern, so that the substrate is exposed according to the pattern of the positive mask.

In a step 640, the first via 750 is formed in the substrate 710. The first via 750 is preferably formed by etching a hole in the substrate 710. Additional vias can be formed as needed in the substrate 710. The via 750 is etched in a location on the substrate that is predetermined to be where select current-carrying elements 735 will be located to connect to current-carrying elements of other substrates in the device 700. In a step 650, the first substrate 710 is subjected to an electrolytic process. The electrolytic process employs an electrode and a solution according to design requirements for the first substrate 710. Components of the electrolytic process, including the electrode and the composition of the electrolytic solution, are selected to provide the desired precursors, i.e. materials forming the conductive layer 730. In a step 660, the remaining non-conductive layer on the first substrate 710 is removed. The current-carrying elements 735 on the first substrate 710 are then polished in a step 670, preferably using CMP.

Once the first substrate 710 is formed, additional substrates 810, 910 can be formed in step 680 to complete the multi-substrate device 700. Subsequent substrates 810, 910 are formed using a combination of the steps 610-670. One or more additional vias, such as the second via 850, may be formed into another substrate as described according to steps 640 and 650. The device 700 may include additional substrates formed as described in steps 610-680, or as described for double-sided substrates above.

Variations may be made to each of the substrates 710, 810 as needed. For example, one or more substrates used in the device can have a voltage switchable dielectric material with a different composition. Accordingly, the external voltage applied to each substrate to overcome the characteristic voltage can therefore vary between substrates. Materials used for the non-conductive layers can also be varied from substrate to substrate. Additionally, the non-conductive layers can be patterned with, for example, different masking, imaging, and/or resist development techniques. Further, the materials used to develop current-carrying elements on the surfaces of the substrates can also be varied from substrate to substrate. For instance, the electrodes used to plate each substrate can be altered or changed for the different substrates, depending on the particular design parameters for the substrates.

Under a variation, it can be preferable for the process to include for at least one double-sided substrate, such as at an end of the stack of substrates. The third substrate 910, for example, can be formed to include current-carrying elements 935 on both planar sides. In this variation, a non-conductive layer is deposited on the first side and the second side of the third substrate 910. The non-conductive layer on the second side can be made of the same material as the first side, although in some applications the second side of the substrate may require a different type of photo-imageable material or other non-conductive surface. The non-conductive layers on each side of the third substrate 910 are then individually patterned. The third substrate 910 is uncovered on the first and second sides when the respective non-conductive layers are patterned. Exposed regions on each side of the substrate may be plated together or in separate plating steps.

Embodiments, such as shown, above can be used in PCB devices. PCBs have a variety of sizes and applications, such as for example, for use as printed wiring boards, motherboards, and printed circuit cards. In general, a high density of current-carrying elements, such as electrical components, leads, and circuitry, are embedded or otherwise included with PCBs. In multi-substrate devices, the size and function of the PCBs can be varied. A device including a PCB under an embodiment of the invention has a substrate formed from a voltage switchable dielectric material. A photoresist such as a dry film resist b can be applied over the substrate. An example of a commercially available dry film resist includes Dialon FRA305, manufactured by Mitsubishi Rayon Co. The thickness of the dry film resist deposited on the substrate is sufficient to allow the substrate to become exposed at selected portions corresponding to where the resist was exposed by the mask.

An electroplating process such as described with respect to FIG. 3 is used to plate conductive materials on exposed regions of the substrate. Substrates formed from a voltage switchable dielectric material can be used for various applications. The voltage switchable dielectric material can be formed, shaped, and sized as needed for the various printed circuit board applications. Examples of printed circuit boards include, for example, (i) motherboards for mounting and interconnecting computer components; (ii) printed wiring boards; and (iii) personal computer (PC) cards and similar devices. Still other applications are provided below.

D. Alternative Embodiments

The following are some examples of variations to one or more of the embodiments described above.

1. Pulse Plating Process

Figure 9:
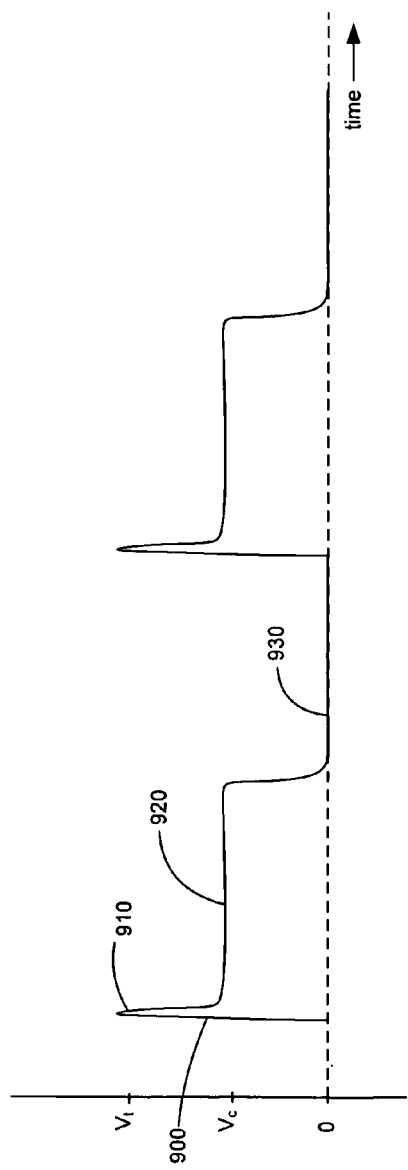
FIG. 9 illustrates an exemplary waveform for a pulse plating process according to an embodiment of the invention.

An embodiment of the invention employs a pulse plating process. In this process, an electrode and a substrate comprising a voltage switchable dielectric material are immersed in an electrolytic solution. A voltage is applied between the electrode and the substrate so that the voltage switchable dielectric material becomes conductive. The applied voltage also causes ions in the electrolytic solution to deposit onto exposed areas of the substrate, thereby plating a current-carrying formation. In the pulse plating process, the voltage is modulated and follows a waveform such as the exemplary waveform 900 shown in FIG. 9. The waveform 900 resembles a square-wave, but further includes a leading edge spike 910. The leading edge spike 910 is preferably a very short duration voltage spike sufficient to overcome a trigger voltage, $V_t$, of the voltage switchable dielectric material, where the trigger voltage is a threshold voltage that must be exceeded in order for the voltage switchable dielectric material to enter the conductive state. In some embodiments, the trigger voltage is relatively large, such as between 100 and 400 volts.

Once the trigger voltage has been exceeded and the voltage switchable dielectric material is in the conductive state, the voltage switchable dielectric material will remain in the conductive state for as long as the voltage applied to the voltage switchable dielectric material remains above a lower clamping voltage, $V_c$. In the waveform 900 of FIG. 9, it will be appreciated that the leading edge spike 910 is followed by a plateau 920 at a voltage above the clamping voltage. The plateau 920 is followed by a relaxation period in which the voltage returns to a baseline 930, such as 0 volts, then the cycle repeats.

2. Reverse Pulse Plating Process

Figure 10:
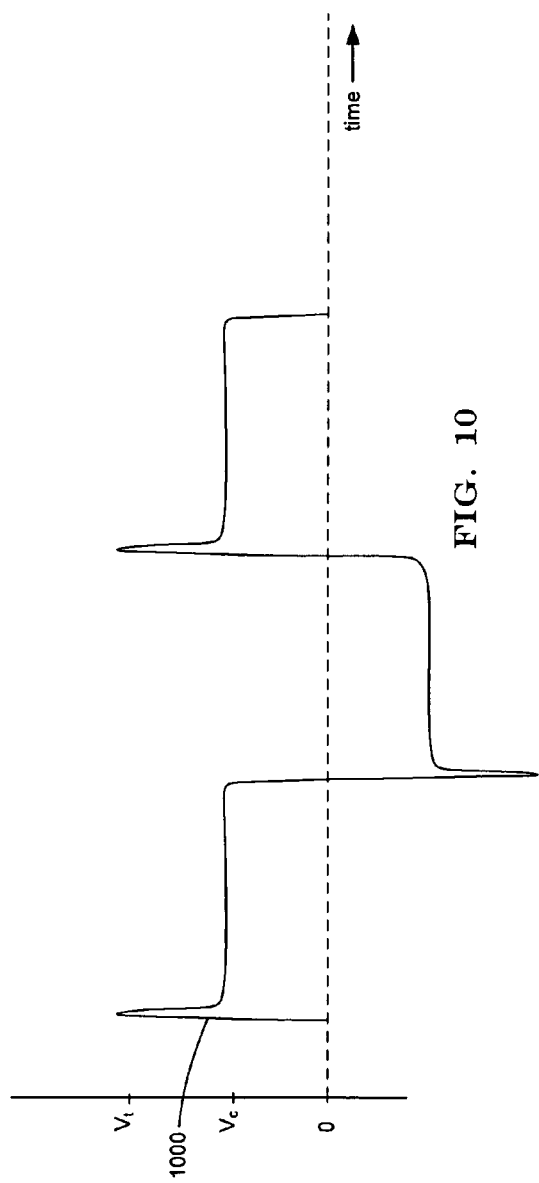
FIG. 10 illustrates an exemplary waveform for a reverse pulse plating process according to an embodiment of the invention.

Another embodiment of the invention employs a reverse pulse plating process. This process is essentially the same as the pulse plating process described above, except that in place of the plateau 920 (FIG. 9) the polarity of the voltage is reversed so that plating occurs at the electrode instead of the substrate. An exemplary waveform 1000 is shown in FIG. 10 in which the positive and negative portions have essentially the same magnitude but opposite polarity. The shape of the negative portion need not match that of the positive portion in either magnitude or duration, and in some embodiments the negative portion of the waveform 1000 does not include a leading edge voltage spike. An advantage to reverse pulse plating is that it produces smoother plating results. When the voltage reverse, those areas on the plating surface where plating occurred most rapidly before the reversal become those areas where dissolution occurs most readily. Accordingly, irregularities in the plating tend to smooth out over time.

3. Depositing and Patterning Non-Conductive Layers

Another embodiment of the invention employs a silk-screening method to develop a patterned non-conductive layer on a substrate comprised of a voltage switchable dielectric material. This embodiment avoids the use of materials such as photoresist to develop the pattern for depositing current-carrying materials on the substrate. In a silk screening process, a robotic dispenser applies a dielectric material to the surface of the substrate according to a preprogrammed pattern. The silkscreen liquid applicant is typically a form of plastic or resin, such as Kapton. In contrast to other embodiments using photoresist materials for the non-conductive layer, silk-screened Kapton, or another plastic or resin, is permanent to the surface of the substrate. As such, silk-screening offers advantages of combining steps for depositing and patterning non-conductive material on the substrate, as well as eliminating steps for removing non-conductive material from the surface of the substrate.

4. Multiple Types of Conductive Materials on a Single Surface

In addition, current-carrying elements may be fabricated onto a surface of a substrate from two or more types of current-carrying materials. The substrate including the voltage switchable dielectric material is adaptable to be plated by several kinds of current-carrying materials. For example, two or more electrolytic processes can be applied to a surface of the substrate to develop different types of current-carrying particles. In one embodiment, a first electrolytic process is employed to deposit a first conductive material in a first pattern formed on the surface of the substrate. Subsequently, a second non-conductive layer is patterned on the substrate including the first conductive material. A second electrolytic process may then be employed to deposit a second conductive material using the second pattern. In this way, a substrate may include multiple types of conductive material. For example, copper can be deposited to form leads on the substrate and another conductive material, such as gold, can be deposited elsewhere on the same surface where superior conduction is necessary.

E. Other Applications for Embodiments of the Invention

Embodiments of the invention include various devices comprising a substrate of a voltage switchable dielectric material upon which a current-carrying formation has been deposited. The current-carrying formation can comprise circuits, leads, electrical components, and magnetic material. Exemplary applications for embodiments of the invention are described or listed below. The applications described or listed herein are merely illustrative of the diversity and flexibility of this invention, and should therefore not be construed as an exhaustive list.

1. Pin Connectors

In an embodiment, a pin connector is provided. For example, the voltage switchable dielectric material is used to form an interior structure of a female pin connector. The voltage switchable dielectric material can be used to form contact leads within the interior structure of the female pin connector. The voltage switchable dielectric material may be shaped into the interior structure using, for example, a mold that receives the voltage switchable dielectric material in a liquid form. The resulting interior structure includes a mating surface that opposes the male pin connector when the two connectors are mated. A plurality of pin receptacles are accessible though holes in the mating surface. The holes and pin receptacles correspond to where pins from the male connector will be received.

Figure 11:
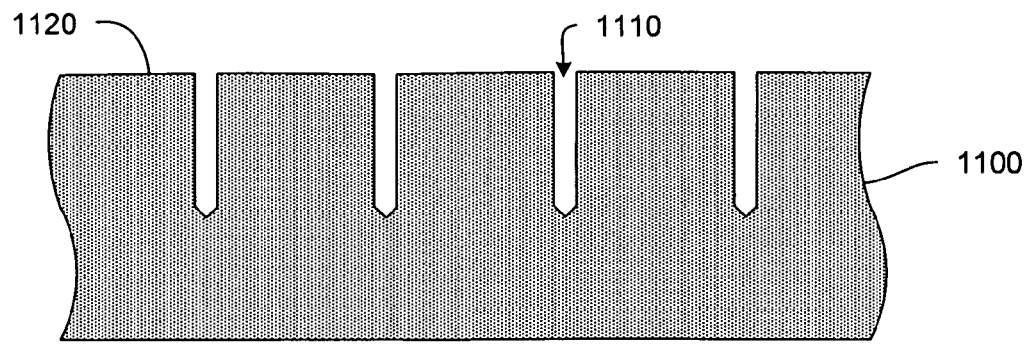
FIG. 11 illustrates a segment of an interior structure of a connector, the segment having exposed pin receptacles according to an embodiment of the invention.
Figure 12:
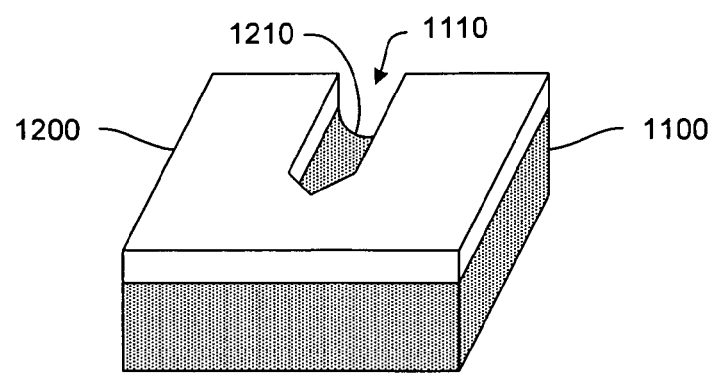
FIG. 12 shows a perspective view of a portion of the segment of FIG. 11 with a mask disposed thereon, according to an embodiment of the invention.

To provide conductive contact elements within the connector, and as shown in FIG. 11, the interior structure may be separated into segments 1100 to expose the lengths of the pin receptacles 1110 that extend to the holes in the mating surface 1120. A non-conductive layer 1200, shown in FIG. 12, such as a photoresist layer may be deposited on one of the segments 1100. The non-conductive layer 1200 may then be patterned so that a bottom surface 1210 of each pin receptacle 1110 is exposed through the non-conductive layer 1200. One or both segments 1100 of the interior structure may then be subjected to an electrolytic plating process. During the plating process, a voltage is applied to the interior structure so that the voltage switchable dielectric material is conductive. A conductive material is then plated on the bottom surface 1210 of each pin receptacle 1110 in the interior structure. Once the contact leads are formed in the pin receptacles 1110, the non-conductive layer 1200 can be removed and the segments 1100 rejoined. The interior structure may also be housed within a shell to complete the female pin connector.

Several advantages exist to forming a pin connector under an embodiment of the invention. Plating the interior structure enables a large number of pin receptacles to be included in the interior structure in one plating process. Further, because the lead contacts can be made thinner, pin receptacles can be formed closer together to reduce dimensions of the pin connector. The pin connector can also provide over-voltage protection properties that are inherent to voltage switchable dielectric materials.

2. Surface Mount Packages

Surface mount packages mount electronic components to a surface of a printed circuit board. Surface mount packages house, for example, resistors, capacitors, diodes, transistors, and integrated circuit devices (processors, DRAM etc.). The packages include leads directed internally or outwardly to connect to the electrical component being housed. Specific examples of surface mounted semiconductor packages include small outline packages, quad flat packages, plastic leaded chip carriers, and chip carrier sockets.

Manufacturing surface mount packages involves forming a frame for the leads of the package. The frame is molded using a material such as epoxy resin. Thereafter, leads are electroplated into the molded frame. In an embodiment of the invention, a voltage switchable dielectric material can be used to form the frame. A non-conductive layer is formed on the frame to define the locations of the leads. The non-conductive layer can be formed during the molding process, during a subsequent molding process, or through a masking process using a photo-imageable material such as described above with respect to previous embodiments. A voltage is applied to the frame during the electroplating process to rendering the frame conductive. The leads form on the frame in locations defined by a pattern of the non-conductive layer.

By using a voltage switchable dielectric material, leads can be made thinner or smaller, allowing for a smaller package that occupies a smaller footprint on the PCB. The voltage switchable dielectric material also inherently provides over-voltage protection to protect contents of the package from voltage spikes.

3. Micro-Circuit Board Applications

Embodiments of the invention also provide micro-circuit board applications. For example, smart cards are credit-card size substrate devices having one or more embedded computer chips. A smart card typically includes a mounted micro-memory module and conductors for interconnecting the micro-memory module with other components such as a sensor for detecting smart card readers. Due to the size of the smart card, as well as the size of the components embedded or mounted to the smart card, conductive elements on the substrate of the smart card also have to be very small.

In an embodiment, a voltage switchable dielectric material is used for the substrate of a smart card. An electrolytic plating process such as described above is used to produce a pattern of connectors on the smart card to connect the memory module to other components. A conductive layer comprising the pattern of connectors is plated onto the surface of the substrate through a photoresist mask as described above. By using a voltage switchable dielectric material, the pattern of connectors can be plated onto the substrate without having to etch. This can reduce the thickness of the conductive layer on the substrate.

Another micro-circuit board application includes a circuit board that packages two or more processors together. The circuit board includes leads and circuits that enable high-level communications between the several processors mounted on the board so that the processors act substantially as one processing unit. Additional components such as a memory can also be mounted to the circuit board to communicate with the processors. Fine circuitry and lead patterns are therefore required to preserve processing speed for communications that pass between two or more processors.

As with previous embodiments, such as the embodiments directed to smart cards, the micro-circuit board also includes a substrate formed from a voltage switchable dielectric material. A fine resist layer is patterned onto the substrate to define a pattern for selected regions of conductive material to be subsequently deposited. An electrolytic process is used to plate conductive material in selected regions according to a pattern to interconnect processors subsequently mounted to the circuit board.

Again, one advantage provided by using voltage switchable dielectric materials is that conductive layers can be made with reduced thicknesses. Another advantage is that plating conductive material with fewer fabrication steps reduces manufacturing costs for the micro-circuit board. Still another advantage is that a micro-circuit board can be developed to have conductive elements formed from more than one type of conductive material. This is particularly advantageous for interconnecting processors on one micro-circuit board because material requirements of the conductors may vary for each processor, depending on the quality, function, or position of each processor. For example, processors of the micro-circuit board that are exposed to the environment may require more durable conductive elements, for example made from nickel, to withstand temperature fluctuations and extremes. Whereas a processor for handling more computationally demanding functions, and located away from the environment, can have contacts and leads formed from a material with a higher electrical conductivity such as gold or silver.

4. Magnetic Memory Device

In another application, a substrate is integrated into a memory device that includes a plurality of memory cells. Each memory cell includes a layer of a magnetic material. The orientation of a magnetic field of the layer of the magnetic material stores a data bit. The memory cells are accessed by electrical leads. Voltages applied to the memory cells via the electrical leads are used to set and to read the orientations of magnetic fields. Transistors mounted to, or formed in, the substrate are used to select the memory cells to be set and to be read.

In an embodiment of the invention, the substrate used in the memory device is formed from a voltage switchable dielectric material. A first non-conductive layer is deposited and patterned on the substrate to define regions where the layer of magnetic material is to be fabricated. A first electrolytic process, as described above, is used to plate the layer of magnetic material on the substrate. The electrolytic process, for example, can be used to plate a cobalt-chromium (CoCr) film as the layer of magnetic material. Similarly, a second non-conductive layer may be deposited and masked on the substrate to define regions where the electrical leads are to be located. A second electrolytic process is then used to plate the electrical leads.

5. Stacked Memory Devices

Under still another embodiment, a multi-substrate memory device includes a plurality of substrates each formed from a voltage switchable dielectric material. The substrates are stacked and are electrically interconnected using one or more vias. As shown by FIGS. 5 and 7, the vias are plated with a current-carrying layer by an electrolytic process. Several advantages are apparent under this embodiment of the invention. The vias can be plated during a fabrication step with one or more of the current-carrying formations formed on the surface of the respective substrates. The plating on the surface of the vias is also less expensive to produce and more reliable than plated vias produced by previous methods, such as by seeding the surfaces of the vias or using adhesives.

6. Flex Circuit Board Devices

Yet another embodiment of the invention provides flex circuit board devices. Flex circuit boards generally include a high density of electrical leads and components. Unfortunately, increasing the density of electrical and conductive elements can diminish the speed and/or capacity of the flex circuit board. Embodiments of the invention provide a flex circuit board that advantageously uses a voltage switchable dielectric material to increase the density of electrical and conductive components on the flex circuit board.

Under an embodiment, a composition of a voltage switchable dielectric material is selected and molded into a flexible and thin circuit board. A resist layer is patterned onto the substrate to define finely spaced regions, as above. A voltage exceeding the characteristic voltage of the particular voltage switchable dielectric material is applied to the voltage switchable dielectric material and a current-carrying formation is plated to form leads and contacts in the finely spaced regions.

By using a voltage switchable dielectric material, current-carrying precursors are deposited directly on the surface of the substrate to form the current-carrying formation. This allows the current-carrying formation to have a reduced thickness in comparison to previous flex circuit board devices. Accordingly, the respective electrical and conductive elements on the surface of the flex circuit board can be thinner and spaced more closely together. An application for a flex circuit board under an embodiment of the invention includes a print head for an ink jet style printer. Thus, the use of a voltage switchable dielectric material enables the flex circuit board to have more finely spaced electrical components and leads resulting in increases printing resolution from the print head.

7. Radio Frequency ID (RFID) Tags

Yet another embodiment of the invention provides RFID tags. In these embodiments the method of the invention can also be used to fabricate antennas and other circuitry on substrates for RFID and wireless chip applications. Additionally, a layer of a voltage switchable dielectric material can be used as an encapsulant.

Conclusion

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A device comprising:
a voltage switchable dielectric (VSD) material;
at least one via passing through the VSD material, wherein a via of the at least one via comprises a conductive sleeve that extends through the via;
a conductive material bonded to the VSD material via an electrochemical bond; and
a pin receptacle, wherein the pin receptacle passes through the VSD material and at least a portion of the conductive material is plated on the bottom surface of the pin receptacle,
wherein at least a portion of the VSD material form an interior structure of a pin connector, the interior structure is separated by a plurality of segments to expose a length of the pin receptacle, and
wherein the VSD material is disposed within a substrate of the device and is configured to be nonconductive during operation of the device and configured to be conductive in response to a voltage that exceeds a characteristic voltage of the VSD material to protect the device against electrical damage.

2. The device of claim 1, wherein at least a portion of the conductive material is deposited on at least a portion of the conductive sleeve of the via.

3. The device of claim 1, wherein the substrate of the device is a PCB or the packaging of a semiconductor chip.

4. A device comprising:
a VSD material;
a via passing through the VSD material, wherein the via comprises a conductive sleeve that extends through the via;
a conductive material bonded to the VSD material via an electrochemical bond; and
a pin receptacle, wherein the pin receptacle passes through the VSD material and at least a portion of the conductive material is plated on the bottom surface of the pin receptacle, and wherein at least a portion of the VSD material form an interior structure of a pin connector, the interior structure is separated by a plurality of segments to expose a length of the pin receptacle.

5. The device of claim 4, wherein at least a portion of the conductive material is bonded within at least a portion of the conductive sleeve of the via.

6. A device comprising:
a VSD material having a characteristic voltage;
a via passing through the VSD material, wherein the via comprises a conductive sleeve that extends through the via; and
a first conductor and a second conductor separated by the VSD material, wherein the first conductor and the second conductor are bonded to the VSD material at least in part by an electrochemical bond formed while the VSD material is maintained in a conductive state in the presence of a voltage that exceeds the characteristic voltage; and a pin receptacle, wherein the pin receptacle passes through the VSD material and at least a portion of the conductive material is plated on a bottom surface of the pin receptacle, and wherein at least a portion of the VSD material form an interior structure of a pin connector, the interior structure is separated by a plurality of segments to expose a length of the pin receptacle.

7. The device of claim 6, wherein at least a portion of the conductive material is bonded within at least a portion of the conductive sleeve of the via.

* * * * *